US008908125B2

(12) United States Patent
Fujita

(10) Patent No.: US 8,908,125 B2
(45) Date of Patent: Dec. 9, 2014

(54) FLUORESCENT SUBSTRATE AND METHOD FOR PRODUCING THE SAME, AND DISPLAY DEVICE

(75) Inventor: Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 66 days.

(21) Appl. No.: 13/639,197

(22) PCT Filed: Jan. 28, 2011

(86) PCT No.: PCT/JP2011/051791
§ 371 (c)(1),
(2), (4) Date: Oct. 4, 2012

(87) PCT Pub. No.: WO2011/129135
PCT Pub. Date: Oct. 20, 2011

(65) Prior Publication Data
US 2013/0021549 A1 Jan. 24, 2013

(30) Foreign Application Priority Data

Apr. 14, 2010 (JP) ................................. 2010-093444

(51) Int. Cl.
*G02F 1/1335* (2006.01)
*H01L 51/52* (2006.01)
*H01L 27/32* (2006.01)

(52) U.S. Cl.
CPC ......... *H01L 51/5271* (2013.01); *H01L 27/3244* (2013.01); *G02F 1/133617* (2013.01)
USPC ................ 349/70; 349/71; 349/104; 349/114

(58) Field of Classification Search
CPC ............ H01L 51/5271; H01L 27/3244; G02F 1/133617
USPC ....................... 349/70–71, 104, 114
See application file for complete search history.

(56) References Cited

U.S. PATENT DOCUMENTS

| 5,126,214 A | 6/1992 | Tokailin et al. |
| 6,469,755 B1 | 10/2002 | Adachi et al. |

(Continued)

FOREIGN PATENT DOCUMENTS

| CN | 101688979 A | 3/2010 |
| JP | 3-152897 A | 6/1991 |

(Continued)

OTHER PUBLICATIONS

International Search Report received for PCT Patent Application No. PCT/JP2011/05179 mailed on May 10, 2011, 5 pages (2 pages of English Translation and 3 pages of PCT Search Report).

(Continued)

*Primary Examiner* — Nathanael R Briggs
(74) *Attorney, Agent, or Firm* — Morrison & Foerster LLP

(57) ABSTRACT

A fluorescent substrate (5) of the present invention includes: a fluorescent layer (3) which emits light by receiving excitation light; and a reflecting film (10) being provided both (i) on a side surface(s) of the fluorescent layer (3) and (ii) on a surface of the fluorescent layer (3), on which surface the excitation light is incident, the reflecting film (10) (I) transmitting a component having a peak wavelength of the excitation light, and (II) reflecting a component having a peak wavelength of the light emitted from the fluorescent layer (3).

16 Claims, 13 Drawing Sheets

(56) References Cited

U.S. PATENT DOCUMENTS

| | | |
|---|---|---|
| 2002/0175619 A1 | 11/2002 | Kita et al. |
| 2006/0158581 A1* | 7/2006 | Komoto et al. .................. 349/71 |
| 2009/0045735 A1* | 2/2009 | Matsunami et al. .......... 313/504 |
| 2009/0116107 A1 | 5/2009 | Kindler et al. |

FOREIGN PATENT DOCUMENTS

| | | |
|---|---|---|
| JP | 11-329726 A | 11/1999 |
| JP | 2000-131683 A | 5/2000 |
| JP | 2002-359076 A | 12/2002 |
| JP | 2008-89945 A | 4/2008 |
| JP | 2010-40976 A | 2/2010 |

OTHER PUBLICATIONS

Kasegawa et al., "Advantages of Phosphor Sheet Structure in LED Backlight System", 16th International Display Workshops (IDW), 2009, pp. 1001-1004.

* cited by examiner

FIG. 15

|  | LUMINANCE (cd/m²) | LUMINANCE CONVERSION EFFICIENCY (%) | TRANSMITTANCE AT PEAK WAVELENGTH OF EXCITATION LIGHT (%) | REFLECTANCE AT PEAK WAVELENGTH OF EMISSION BY FLUORESCENT MATERIAL (%) | COMPARISON WITH COMPARATIVE EXAMPLE |
|---|---|---|---|---|---|
| COMPARATIVE EXAMPLE 1 | 1,023 | 100 | 100 | 0 | - |
| EXAMPLE 1 | 3,880 | 380 | 80 | 80 | 3.8 TIMES LARGER |
| EXAMPLE 2 | 3,902 | 380 | 80 | 80 | 3.8 TIMES LARGER |
| EXAMPLE 3 | 1,605 | 160 | 30 | 90 | 1.6 TIMES LARGER |
| EXAMPLE 4 | 3,060 | 300 | 60 | 85 | 3.0 TIMES LARGER |
| EXAMPLE 5 | 2,848 | 280 | 85 | 50 | 2.8 TIMES LARGER |
| EXAMPLE 6 | 945 | 92 | 90 | 4 | 0.9 TIMES LARGER |
| EXAMPLE 7 | 4,815 | 471 | 90 | 90 | 4.7 TIMES LARGER |
| EXAMPLE 8 | 273 | 27 | 5 | 92 | 0.3 TIMES LARGER |
| EXAMPLE 9 | 3,898 | 380 | 80 | 80 | 3.8 TIMES LARGER |
| EXAMPLE 10 | 3,823 | 370 | 80 | 80 | 3.7 TIMES LARGER |
| EXAMPLE 11 | 3,912 | 380 | 80 | 80 | 3.8 TIMES LARGER |
| EXAMPLE 12 | 3,879 | 380 | 80 | 80 | 3.8 TIMES LARGER |
| EXAMPLE 13 | 3,901 | 380 | 80 | 80 | 3.8 TIMES LARGER |
| EXAMPLE 14 | 4,829 | 470 | 80 | 85 | 4.8 TIMES LARGER |

FLUORESCENT SUBSTRATE AND METHOD FOR PRODUCING THE SAME, AND DISPLAY DEVICE

CROSS REFERENCE TO RELATED APPLICATIONS

This is a National Phase patent application of PCT/JP2011/051791, filed Jan. 28, 2011, which claims priority to Japanese Patent Application No. 2010-093444, filed Apr. 14, 2010, each of which is hereby incorporated by reference in the present disclosure in its entirety.

TECHNICAL FIELD

The present invention relates to a fluorescent substrate, a method for producing the fluorescent substrate, and a display device using the florescent substrate.

BACKGROUND ART

Demand for flat panel displays has been increased as a society has become a sophisticated information society. Displays known as such flat panel displays encompass non light-emitting liquid crystal displays (LCD), light-emitting plasma displays (PDP), inorganic electroluminescence (inorganic EL) displays, and organic electroluminescence (organic EL) displays. Among them, the organic EL displays attract attention due to their light-emitting properties.

In a field of the organic EL displays, two display arts are well known. One of the two display arts is an art to display a moving image by driving organic EL elements in a simple matrix manner. The other of the two display arts is an art to display a moving image by driving organic EL elements in an active matrix manner by use of thin film transistors (TFTs).

A conventional display is such that each pixel unit includes a plurality of pixels for emitting red, green, and blue lights. Hence, each pixel unit can display various colors such as white so that a full color image can be displayed. In the case of the organic EL elements, red, green, and blue pixels are generally provided by providing different organic light-emitting layers by a mask deposition method using a shadow mask. This makes it possible to realize full color image display.

In this method, however, a mask processing accuracy, a mask alignment accuracy, and an increase in a mask size become serious issues. These issues become serious particularly in a filed of a large-size display such as a television device. In this filed, a substrate size becomes larger and larger. For example, the substrate size is 1500 mm×1850 mm in the sixth generation (G6). Then, it is increased to 2200 mm×2500 mm in the eighth generation (G8) and 2850 mm×3050 mm in the tenth generation (G10) sequentially. In a conventional method, a mask needs to have a size equal to or larger than a substrate size. In view of the circumstances, it is necessary to prepare or process a mask corresponding to a large substrate.

A mask is generally formed by a very thin metal. A film thickness of the mask is typically in a range of about 50 nm to 100 nm. This makes it very difficult to increase a mask size. Also, even in a case where a mask size is increased, there are deteriorations in mask processing and mask alignment accuracy. This may cause two or more light-emitting layers to be provided in a same region. Accordingly, lights emitted from the different light-emitting layers are adversely mixed in color and thereby cause deterioration in quality of display color. In order to prevent this problem, an insulating layer having a wide width is normally provided between pixels. However, in a case where an area of each pixel is fixed, this increases an area of a non light-emitting section. That is, there is a decrease in aperture ratio in each pixel. This causes a decrease in luminance, which in turn causes an increase in power consumption. This ultimately shortens a lifetime of the device.

According to a conventional manufacturing method of the organic EL display, an organic layer is deposited by placing a deposition material below a substrate and depositing an organic material upwardly in a vertical direction. However, there is a problem that as a substrate size is increased (as a mask size is increased), a mask deflects in the center. In a case where the mask deflects as such, there is caused the adverse mixture of lights of different colors. Further, the organic layer is formed only partially, and there is a risk that a current supplied to upper and lower electrodes leaks and thereby causes a failure. The aforementioned problem is similarly caused even in a case where the mask is thermally expanded.

In the conventional manufacturing method, a mask decays each time it is used. As such, one mask can be used only for the fixed number of times. Such limitation gives rise to a cost increase problem in a case where a mask size is increased. In fact, a cost issue has become a most serious problem in the field of the organic EL displays.

As described so far, as the substrate size is increased, the conventional method in which the different light-emitting layers are thus formed with the use of the shadow mask causes a very serious problem. As such, organic EL elements in a large-size substrate have not been successfully manufactured yet, and only organic EL elements in a substrate of half the size of G4 substrate size have been successfully manufactured.

In contrast, Patent Literature 1 proposes a method of outputting full color light by using a combination of (i) an organic EL element which has a light-emitting layer for emitting light in a range of a blue color to a turquoise blue color, (ii) a green pixel which has a fluorescent layer for emitting green light by absorbing the light in the range of the blue color to the turquoise blue color, emitted from the organic EL element, (iii) a red pixel which has a fluorescent layer for emitting red light by absorbing the light in the range of the blue color to the turquoise blue color, and (iv) a blue pixel which has a blue color filter to improve a color purity. According to the method, it is unnecessary to pattern an organic layer. For this reason, an organic EL element can be manufactured more easily at a lower cost, as compared to the case of the method in which the different light-emitting layers are formed with the use of the shadow mask. Further, because there is no limitation due to mask use, the organic EL element can be easily manufactured with a large-size substrate.

However, in a case where excitation light emitted from light source 104 enters a fluorescent layer 103 provided on a substrate 101, light emitted from the fluorescent layer 103 isotropically spreads (see FIG. 11). As such, a light component (see arrows 106 shown in full lines in FIG. 11) emitted to a light-extraction side (to a substrate 101) can be outputted to an outside as useful light, whereas light components (see arrows 107 shown in dashed lines in FIG. 11) emitted from a side surface of the fluorescent layer 103 and an opposite surface of the light-extraction side cannot be extracted to the outside. As such, there is a light emission loss. The light which can be actually extracted to the light-extraction side accounts for only about 10% of total light emission. This results in an increase in power consumption. As such, the light emission loss is considered as a serious problem in a field of display devices.

As a solution to the problem, Patent Literature 3 proposes a method of efficiently extracting, to a front side, light emitted from a side surface of a fluorescent layer. In the method, a reflecting film is provided on a side surface of the fluorescent layer so as to redirect the light to the front side. However, the method faces a problem that it cannot extract a light component emitted toward a light source side (a side opposite to a light-extraction side).

Each of Patent Literature 2 and Non-Patent Literature 1 proposes such a light-emitting display device obtained by applying a method of employing a fluorescent material to a conventional liquid crystal display device. Unlike the conventional liquid crystal display device, the proposed display devices are such that RGB fluorescent layers provided outside a liquid crystal layer emit light. As such, it is possible to realize the display devices which are excellent in viewing angle characteristics.

However, in each of the proposed light-emitting display devices, light emitted from the fluorescent layer isotropically spreads in the same manner as described above. This causes a similar problem that there is a huge loss of light extracted to the outside from the fluorescent layer, and, as a result, light-emitting efficiency of light thus obtained is reduced. Such a reduction in light-emitting efficiency results in an increase in power consumption. This becomes a serious problem in the field of display devices.

CITATION LIST

Patent Literature

Patent Literature 1
Japanese Patent Application Publication, Tokukaihei, No. 3-152897 A (Publication Date: Jun. 28, 1991)
Patent Literature 2
Japanese Patent Application Publication, Tokukai, No. 2000-131683 A (Publication Date: May 12, 2000)
Patent Literature 3
Japanese Patent Application Publication, Tokukaihei, No. 11-329726 A (Publication Date: Nov. 30, 1999)

Non-Patent Literature

Non-patent Literature 1
The Institute of Image Information and Television Engineers, Proceedings from the 16th International Display Workshops (IDW '09), p. 1001, 2009

SUMMARY OF INVENTION

Technical Problem

The present invention is made in view of the problems, and an object of the present invention is to provide (i) a fluorescent substrate which can have an improvement in efficiency of extracting light from a fluorescent layer and have a significant improvement in conversion efficiency, and (ii) a method for manufacturing the fluorescent substrate.

Another object of the present invention is to provide a display device which (i) is excellent in viewing angle characteristic, that is, the display device which is capable of displaying an image successfully free from a color purity shift and a luminance shift at any viewing angle, (ii) can be manufactured at a lower cost, and (iii) achieves a decrease in power consumption.

Solution to Problem

In order to attain the object, a fluorescent substrate of the present invention includes: a fluorescent layer which emits light by receiving excitation light; and a reflecting film being provided both (i) on a side surface(s) of the fluorescent layer and (ii) on a surface of the fluorescent layer, on which surface the excitation light is incident, the reflecting film (I) transmitting a component having a peak wavelength of the excitation light, and (II) reflecting a component having a peak wavelength of the light emitted from the fluorescent layer.

According to the arrangement, the reflecting film transmits the component having the peak wavelength of the excitation light, so that it is possible to minimize a loss of the excitation light which travels to the fluorescent layer. Further, according to the arrangement, the reflecting film reflects the component having the peak wavelength of the light emitted from the fluorescent layer. As such, even though the light is istropiclaly emitted in the fluorescent layer, light emitted toward the side surfaces of the fluorescent layer is returned (reflected) to the inner part of the fluorescent layer by the reflecting film on the side surfaces of the fluorescent layer. By this, the reflecting film can prevent loss of the light emitted toward the side surfaces of the fluorescent layer. As such, it is possible to re-extract, from a desired extraction point, the light emitted toward the side surfaces of the fluorescent layer. Further, that portion of the isotropically emitted light, which is emitted toward the excitation light incident surface of the fluorescent layer, is returned (reflected) to the inner part of the fluorescent layer by the reflecting film, so that it is possible to extract this portion of the isotropically emitted light from a light-extraction direction of the fluorescent layer. With the arrangement described above, it is thus possible to greatly improve light-emitting efficiency, that is, it is possible to greatly increase a luminance of light emitted in the light-extraction direction.

In the case of an illuminant like the fluorescent layer, light emitted from a surface on which excitation light is incident (excitation light entrance surface) accounts for 30% of a total light emission, and light emitted from a side surface accounts for 40% of the total light emission. In view of the circumstances, it is very effective to increase a luminance efficacy of extracting, to the light-extraction direction, leak light emitted from the excitation light entrance surface and the side surface(s).

In order to attain the object, a method of the present invention of manufacturing a fluorescent substrate includes the steps of: (a) providing a fluorescent layer on a substrate, the fluorescent layer emitting light by receiving excitation light; and (b) providing a film both (i) on a side surface(s) of the fluorescent layer and (ii) on a surface of the fluorescent layer, on which surface the excitation light is incident, the film (I) transmitting a component having a peak wavelength of the excitation light and (II) reflecting a component having a peak wavelength of the light emitted from the fluorescent layer.

The method can manufacture a fluorescent substrate in which in a light-emitting efficacy is increased (that is, a luminance of light extracted to a light-extraction direction is increased).

In order to attain the object, a display device of the present invention includes: a fluorescent substrate recited above; and a light source for emitting, toward the fluorescent substrate, excitation light which (i) has a peak wavelength in a range from an ultraviolet region to a blue-color region and (ii) excites the fluorescent layer.

The arrangement makes it possible to improve a light-emitting efficacy of the display device and decreases power consumption and a cost.

Advantageous Effects of Invention

A fluorescent substrate of the present invention includes: a fluorescent layer which emits light by receiving excitation light; and a reflecting film being provided both (i) on a side surface(s) of the fluorescent layer and (ii) on a surface of the fluorescent layer, on which surface the excitation light is incident, the reflecting film (I) transmitting a component having a peak wavelength of the excitation light, and (II) reflecting a component having a peak wavelength of the light emitted from the fluorescent layer.

This makes it possible to provide the fluorescent substrate in which there is an increase in efficiency of extracting the light emitted from the fluorescent layer and there is even a great increase in an conversion efficiency.

A method of the present invention of manufacturing a fluorescent substrate includes the steps of: (a) providing a fluorescent layer on a substrate, the fluorescent layer emitting light by receiving excitation light; and (b) providing a film both (i) on a side surface(s) of the fluorescent layer and (ii) on a surface of the fluorescent layer, on which surface the excitation light is incident, the film (I) transmitting a component having a peak wavelength of the excitation light and (II) reflecting a component having a peak wavelength of the light emitted from the fluorescent layer.

The method can manufacture a fluorescent substrate in which a light-emitting efficacy is increased (that is, a luminance of light extracted to a light-extraction direction is increased).

A display device of the present invention includes: a fluorescent substrate recited above; and a light source for emitting, toward the fluorescent substrate, excitation light which (i) has a peak wavelength in a range from an ultraviolet region to a blue-color region and (ii) excites the fluorescent layer.

The arrangement makes it possible to provide a display device which (i) has excellent viewing angle characteristics, i.e., a display device capable of displaying an image successfully free from color purity shift and luminance shift at any viewing angle, (ii) can be manufactured at a lower cost, and (iii) can achieve a decrease in power consumption.

BRIEF DESCRIPTION OF DRAWINGS

FIG. 15 is a table illustrating results of Comparative Example and Examples.

DESCRIPTION OF EMBODIMENTS

An embodiment of the present invention is described below with reference to FIGS. 1 through 7 and 12.

[Brief Description of Present Invention]

First, the following description will briefly describe the present invention. A fluorescent substrate 5 of the present invention includes: a fluorescent layer 3 which emits light by receiving excitation light; and a reflecting film 10 being provided both (i) on a side surface(s) of the fluorescent layer 3 and (ii) on a surface of the fluorescent layer 3, on which surface the excitation light is incident, (excitation light incident surface). The reflecting film 10 (i) transmits a component having a peak wavelength of the excitation light, and (ii) reflects a component having a peak wavelength of the light emitted from the fluorescent layer 3.

According to the arrangement, the reflecting film transmits the component having the peak wavelength of the excitation light, so that it is possible to minimize a loss of the excitation light which travels to the fluorescent layer 3. Further, according to the arrangement, the reflecting film reflects the component having the peak wavelength of the light emitted from the fluorescent layer. This makes it possible to change (i) a direction of light emitted toward the side surface(s) of the fluorescent layer 3 and (ii) a direction of light emitted toward the excitation light incident surface of the fluorescent layer 3 so that the light emitted toward the side surface(s) of the fluorescent layer 3 and the light emitted toward the excitation light incident surface of the fluorescent layer 3 are extracted in a light-extraction direction of the fluorescent substrate 5 (see arrows 6 shown in full lines in FIG. 1). With the arrangement described above, it is thus possible to greatly improve light-emitting efficiency, that is, it is possible to greatly increase a luminance of light emitted in the light-extraction direction.

In a case of a light-emitting member like the fluorescent layer 3, light emitted toward an excitation light incident surface accounts for 30% of a total light-emission amount, whereas light emitted toward a side surface(s) accounts for 40% of the total light-emission amount. Accordingly, causing the light emitted toward the excitation light incident surface and the light emitted toward the side surface(s) not to be leaked but to be directed in the light-extraction direction is very effective in improving the light-emitting efficiency.

Figure 12:
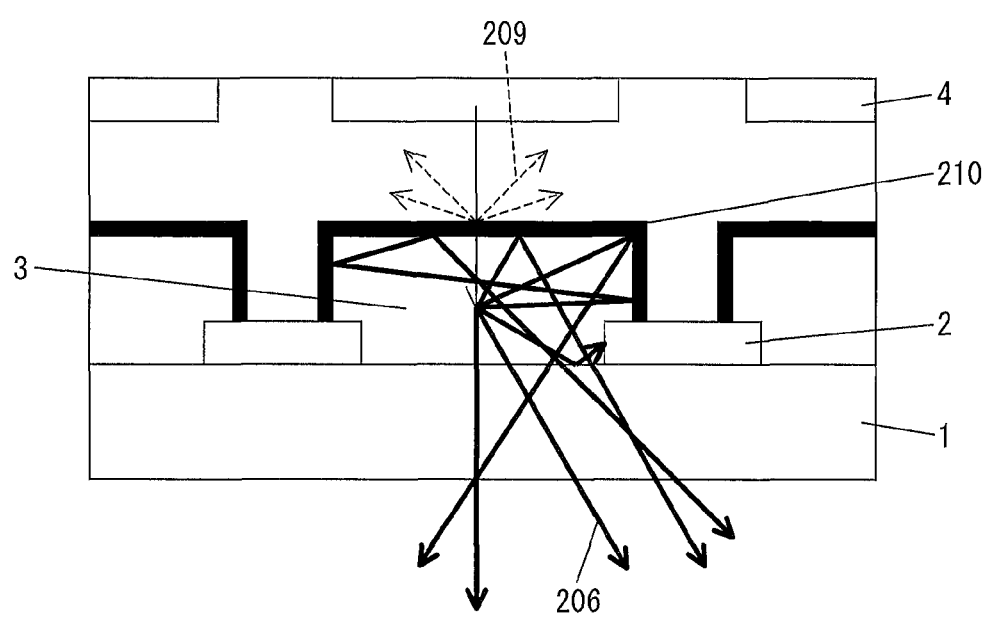
FIG. 12 is a cross sectional view schematically illustrating a configuration example of a display device in accordance with a conventional art.

Meanwhile, as in a case of a conventional display device illustrated in FIG. 12, in which a fluorescent layer 3 provided on a substrate 1 is covered with a reflecting plate 210 made from a metal, it is possible to reflect light emitted inside the fluorescent layer 3 and therefore efficiently extract the light to an outside (see arrows 206 shown in full lines in FIG. 12). In this case, however, the reflecting plate 210 similarly reflects excitation light for exciting the fluorescent member, which excitation light is emitted from a light source 4 (see arrows 209 shown in dashed lines in FIG. 12). Consequently, there is a decrease in intensity of excitation light which reaches the fluorescent layer 3. This decreases intensity of light which can be extracted to the outside.

That is, achieving both the following (i) and (ii) is an important factor in improvement in light extraction efficiency: (i) a decrease in loss of excitation light entering the fluorescent layer 3; and (ii) a decrease in loss of light emitted from the fluorescent layer 3 due to light directed in a direction different from the light-extraction direction.

The present invention is made based on a fact that the excitation light and the light emitted from the fluorescent layer 3 are different from each other in wavelength of a luminescence spectrum. According to the present invention, the reflecting layer 10 is provided on the fluorescent layer 3, which reflecting layer 10 (i) efficiently transmits the excitation light and (ii) efficiently reflects the light emitted from the fluorescent layer 3, so that the light emitted from the fluorescent layer 3 is efficiently extracted in the light-extraction direction. It is therefore possible to cause efficiently the light emitted from the fluorescent member to be extracted in the light-output direction. It is preferable that the reflecting layer 10 covers surfaces of the fluorescent layer 3 except for a surface in the light-extraction direction.

Here, it is preferable that the reflecting layer 10 of the fluorescent substrate 5 transmits 80% or more of a component having a peak wavelength of the excitation light and reflects 80% or more of a component having a peak wavelength of the light emitted from the fluorescent layer 3. This makes it possible to more efficiently extract, to the outside, light isotropically emitted from the fluorescent layer 3. It is thus possible to improve the light-emitting efficiency.

It is preferable that the fluorescent layer 3 is provided so as to have a tapered shape in the fluorescent substrate 5. With the arrangement, it is possible to provide the reflecting layer 5 both on the side surface(s) and on the excitation light incident surface of the fluorescent layer 3 easily and simultaneously. This can prevent an increase in cost. Further, since the reflecting layer 10 can be uniformly provided on the fluorescent layer 3, it is possible to cause, more efficiently, the light isotropically emitted from the fluorescent layer 3 to be in the light-extraction direction. Note that, if the reflecting layer 10 is not uniform, then there is unevenness in reflection characteristic. This results in a decrease in light-extraction efficiency.

[Arrangement of Display Device 50]

With reference to FIGS. 1 through 5, the following description will concretely discuss (i) constituent members of a display device 50 of the present embodiment and (ii) a method of providing each of the constituent members. However, the present invention is not limited to the constituent members and the method described below.

Figure 1:
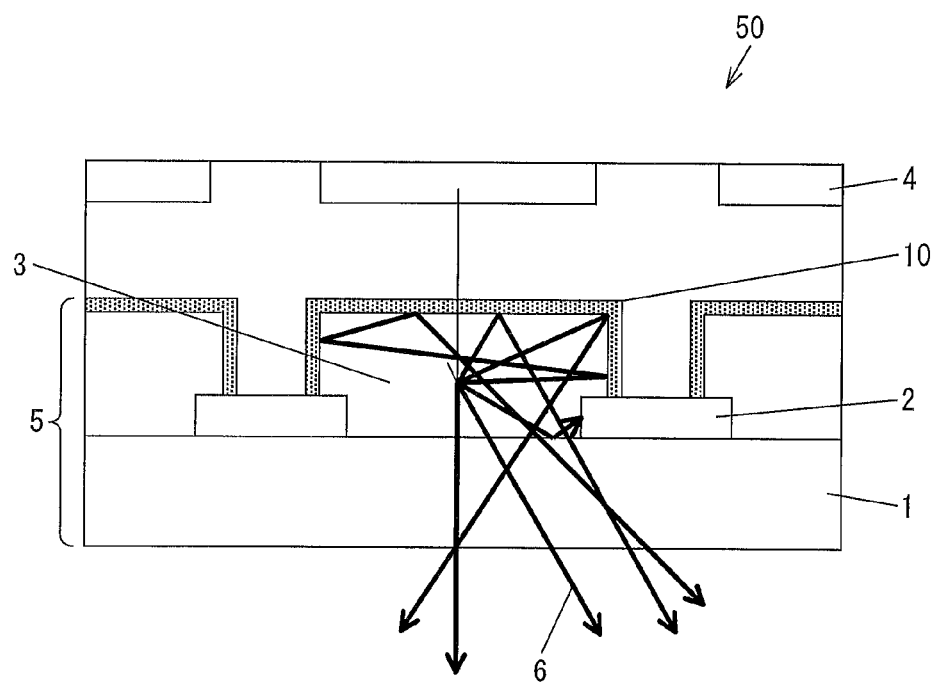
FIG. 1 is a cross sectional view schematically illustrating a configuration example of a display device in accordance with an embodiment of the present invention.

FIG. 1 is a cross sectional view schematically illustrating a configuration example of the display device 50 of the present embodiment. As illustrated in FIG. 1, the display device 50 includes the fluorescent substrate 5 and a light source 4 which causes excitation of the fluorescent layer 3 provided in the fluorescent substrate 5. The fluorescent substrate 5 includes, on the substrate 1, (i) the fluorescent layer 3 which emits light by receiving the excitation light, (ii) a light-absorbing layer 2 provided between the fluorescent layer 3 and another fluorescent layer 3 adjacent to the fluorescent layer 3, and (iii) the reflecting layer 10 which (I) is provided both on the side surface of the fluorescent layer 3 and on a surface of the fluorescent layer 3, which faces the light source 4, and (II) transmits the component having the peak wavelength of the excitation light and reflects the component having the peak wavelength of the light emitted from the fluorescent layer 3.

(Substrate 1)

It is necessary for the substrate 1 to have such a characteristic that light emitted from the fluorescent layer 3 is transmitted via a light-emitting region of the fluorescent layer 3 and therefore the light emitted from the fluorescent layer 3 is extracted to the outside. For this reason, it is preferable that the substrate 1 is made from a material having light translucency. For example, the substrate 1 may be a substrate made from an inorganic material such as glass or quartz, a plastic substrate made from polyethylene terephthalate, polycarbazole, or polyimide, or a like substrate. Among them, it is preferable to employ the plastic substrate because, with the plastic substrate, it is possible to form, without any stress, a curved section and a folded section.

Generally, an organic EL element is deteriorated in quality due to moisture, even if an amount of moisture is small. The plastic substrate transmits a certain amount of moisture constantly. As such, use of the plastic substrate as a substrate on which an organic EL element is provided generally has a problem that the organic EL element is deteriorated in quality due to moisture (this is a most serious problem for the organic EL element.). In view of the circumstances, it is more preferable to use, as the substrate 1 on which the fluorescent layer 3 is provided, a plastic substrate coated with an inorganic material. Such a substrate has an improvement in gas barrier property and is thereby capable of blocking moisture. With such a substrate, it is therefore possible to prevent the deterioration of the organic EL element due to moisture.

(Fluorescent Layer 3)

The fluorescent layer 3 includes at least a blue fluorescent layer, a red fluorescent layer, and a green fluorescent layer. The blue fluorescent layer absorbs the excitation light emitted from the light source 4 and emits blue light. The red fluorescent layer absorbs the excitation light emitted from the light source 4 and emits red light. The green fluorescent layer absorbs the excitation light emitted from the light source 4 and emits green light. Note that the light source 4 is an ultraviolet-emitting organic EL element, a blue-emitting organic EL element, an ultraviolet-emitting LED, a blue-emitting LED, or the like.

If necessary, the fluorescent layer 3 may further include a fluorescent layer which emits cyan or yellow light. With the arrangement, it is possible to expand a color reproduction range in such a manner that, on a chromaticity diagram, a chromatic purity of each pixel that emits cyan light or yellow light is positioned outside a triangular range defined by lines connecting, to each other, points of chromatic purities of pixels which emit, respectively, red light, green light, or blue light.

The fluorescent layer 3 is not particularly limited, as long as it is made from any one of fluorescent materials listed below. Note, however, that the fluorescent layer 3 is not limited to these. The fluorescent layer 3 can optionally contain an additive. Alternatively, the fluorescent layer 3 can have an arrangement in which a fluorescent material is dispersed in a polymer material (binder resin) or in an inorganic material. The fluorescent material may be a known fluorescent material and is categorized into an organic fluorescent material or an inorganic fluorescent material. Specific compounds which can be used as these materials are described below.

(Example of Organic Fluorescent Material)

Examples of the organic fluorescent material are listed below. First, examples of a fluorescent dye for converting ultraviolet excitation light into blue light encompass (i) a stilbenzene dye such as 1,4-bis(2-methylstyryl) benzene and trans-4,4'-diphenylstilbenzene, and (ii) a coumarin dye such as 7-hydroxy-4-methylcoumarin.

Secondly, examples of a fluorescent dye for converting ultraviolet or blue excitation light into green light encompass (i) a coumarin dye such as 2,3,5,6-1H, 4H-tetrahydro -8-triplomethylquinolizine (9,9a, 1-gh) coumarin (coumarin 153), 3-(2'-benzothiazolyl)-7-diethylaminocoumarin (coumarin 6), 3-(2'-benzoimidazolyl)-7-N, and N-diethylaminocoumarin (coumarin 7), and (ii) a naphthalimide dye such as basic yellow 51, solvent yellow 11, and solvent yellow 116.

Thirdly, examples of a fluorescent dye for converting ultraviolet or blue excitation light into red light encompass (i) a cyanine dye such as 4-dicyanomethylene-2-methyl-6-(p-dimethylaminostyryl) -4H-pyrane, (ii) a pyridine dye such as 1-ethyl-2-[4-(p-dimethylaminophenyl)-1,3-butadienyl]-pyridinium-perchlorate, and (iii) a rhodamine dye such as rhodamine B, rhodamine 6G, rhodamine 3B, rhodamine 101, rhodamine-110, basic violet 11, and sulforhodamine 101.

(Example of Inorganic Fluorescent Material)

Examples of the inorganic fluorescent material are listed below. First, examples of a fluorescent material for converting ultraviolet excitation light into blue light in encompass $Sr_2P_2O_7:Sn^{4+}Sr_4Al_{14}O_{25}:Eu^{2+}$, $BaMgAl_{10}O_{17}:Eu^{2+}$, $SrGa_2S_4: Ce^{3+}$, $CaGa_2S_4:Ce^{3+}$, $(Ba, Sr)(Mg, Mn)Al_{10}O_{17}:Eu^{2+}$, $(Sr, Ca, Ba_2, 0\ Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr, Ca, Ba)_5(PO_4)_3Cl:Eu^{2+}$, $BaMg_2Al_{16}O_{27}:Eu^{2+}$, $(Ba, Ca)_5(PO_4)_3Cl:Eu^{2+}$, $Ba_3MgSi_2O_8: Eu^{2+}$, and $Sr_3MgSi_2O_8:Eu^{2+}$.

Secondly, examples of a fluorescent material for converting ultraviolet or blue excitation light into green light encompass $(BaMg)Al_{16}O_{27}:Eu^{2+}, Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5: Ce^{3+}, Tb^{3+}$, $Sr_2P_2O_7—Sr_2B_2O_5:Eu^{2+}$, $(BaCaMg)_5(PO_4)_3Cl:Eu^{2+}$, $Sr_2Si_3O_{8-2}SrCl_2:Eu^{2+}$, $Zr_2SiO_4$, $MgAl_{11}O_{19}: Ce^{3+}, Tb^{3+}$, $Ba_2SiO_4:Eu^{2+}$, $Sr_2SiO_4:Eu^{2+}$, and $(BaSr)SiO_4:Eu^{2+}$.

Thirdly, examples of a fluorescent material for converting ultraviolet or blue excitation light into red light encompass $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P, V)O_4:Eu^{3+}$, $Mg_4GeO_{5.5}F: Mn^{4+}$, $Mg_4GeO_6: Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

(Inorganic Fluorescent Material)

It is preferable that the fluorescent material is an inorganic fluorescent material. This makes it possible to cause light returning from a side surface of the reflecting film 10 into the fluorescent layer 3 to travel toward a light-extraction side (according to a conventional technique, this light is reflected between side surfaces of the reflecting film 10, and deactivated due to self-absorption in the fluorescent layer 3) by taking advantage of a scattering effect (a scattering effect of an inorganic fluorescent material) of the fluorescent layer 3. As a result, it becomes possible to efficiently extract, to the outside, the light emitted from the fluorescent layer 3. Accordingly, it is possible to further improve the light-emitting efficiency.

A surface modification treatment may be carried out to the inorganic fluorescent material. The surface modification treatment can be a chemical treatment in which a silane coupling agent or the like is used or a physical treatment in which fine particles of submicron orders or the like are added. Alternatively, surface modification treatment can be a combination of the chemical treatment and the physical treatment. It is preferable to use an inorganic material in consideration of resistibility to deterioration caused by excitation light or emitted light. In a case where an inorganic material is used, it is preferable that an average particle diameter (d50) of the inorganic material is in a range of 1 μm to 50 μm. If the average particle diameter of the inorganic material is 1 μm or smaller, then there is a drastic decrease in light-emitting efficiency of the fluorescent layer 3. In contrast, if the average particle diameter of the inorganic material is 50 μm or larger, then it is difficult to provide a flat film. As such, in a case where an organic EL element is used as the light source 4, for example, there is a depletion region (refractive index: about 1.0) between the inorganic fluorescent layer (refractive index: about 2.3) and the organic EL element (refractive index: about 1.7). This prevents light emitted from the organic EL element from efficiently reaching the inorganic fluorescent layer, and thereby gives rise to a problem that the light-emitting efficiency of the fluorescent layer 3 is decreased. Further, in a case where it is difficult to flatten the fluorescent layer 3, there is a problem that a liquid crystal layer cannot be provided between the fluorescent substrate 5 and the light source 4. Specifically, a distance between electrodes, between which the liquid crystal layer is sandwiched, is not constant so that it is impossible to uniformly apply an electric field across the liquid crystal layer. As such, the liquid crystal layer does not uniformly function.

(Formation of Fluorescent Layer 3)

The fluorescent layer 3 can be formed by a known wet process. The wet process employs a fluorescent material and a coating solution for forming a fluorescent layer. The coating solution is such a solution that a resin material is dissolved and dispersed in a solvent. Alternatively, the fluorescent layer 3 can be formed by a dry process, a laser transfer method, or the like. The wet process can be a known wet process such as (i) a coating method such as a spin coating method, a dipping method, a doctor blade method, a discharge coat method (nozzle coat method), or a spray coat method, or (ii) a printing method such as an ink jet method, a relief printing method, an intaglio printing method, a screen printing method, or a micro gravure coating method.

Alternatively, the fluorescent layer 3 can be formed from the above listed material(s) by the dry process, the laser transfer process, or the like. The dry process can be a known process such as a resistance heating vapor-deposition method, an electron beam (EB) vapor-deposition method, a molecular beam epitaxy (MBE) method, a sputtering method, an organic vapor phase deposition (OVPD) method, or the like.

In the forming of the fluorescent layer 3, a photosensitive resin can be used as a polymer resin. With the arrangement, it is possible to pattern the photosensitive resin by a photolithography method. The photosensitive resin can be a photosensitive resin (light curable resist material) having a reactive vinyl group, such as an acrylate resin, a methacrylate resin, a poly cinnamate vinyl resin, a vulcanite resin, or the like. The photosensitive resin can be a single photosensitive resin or a combination of two or more photosensitive resins.

The fluorescent material can be directly patterned. The patterning can be carried out by a wet process, a dry process, a laser transfer method, or the like. The wet process can be an ink jet method, a relief printing method, an intaglio method, a screen printing method or the like. The dry process can be a resistance heating vapor-deposition method in which a shadow mask is used, an electron beam (EB) vapor-deposition method, a molecular beam epitaxy (MBE) method, a sputtering method, an organic vapor phase deposition (OVPD) method, or the like.

The fluorescent layer 3 has generally a film thickness in a range of about 100 nm to about 100 μm. Note that it is preferable that the film thickness of the fluorescent layer 3 is in a range of 1 μm to 100 μm. If the film thickness of the fluorescent layer 3 is smaller than 100 nm, then light emitted from the light source 4 cannot be sufficiently absorbed by the fluorescent layer 3. This gives rise to a problem that the light-emitting efficiency is decreased and chromatic purities become low. In view of the circumstances, it is preferable that the film thickness of the fluorescent layer 3 is 1 μm or larger so that the light emitted from the light source 4 can be absorbed more and there is no adverse effect on the chromatic purities. In contrast, if the film thickness of the fluorescent layer 3 is larger than 100 μm, there is no improvement in light-emitting efficiency. This is because the light emitted from the light source 4 can be sufficiently absorbed by the fluorescent layer 3 having a film thickness of not more than 100 μm. Hence, causing the fluorescent layer 3 to have a film thickness of more than 100 μm merely consumes a material, and leads to an increase in material cost.

(Cross Section of Fluorescent Layer 3)

Figure 2:
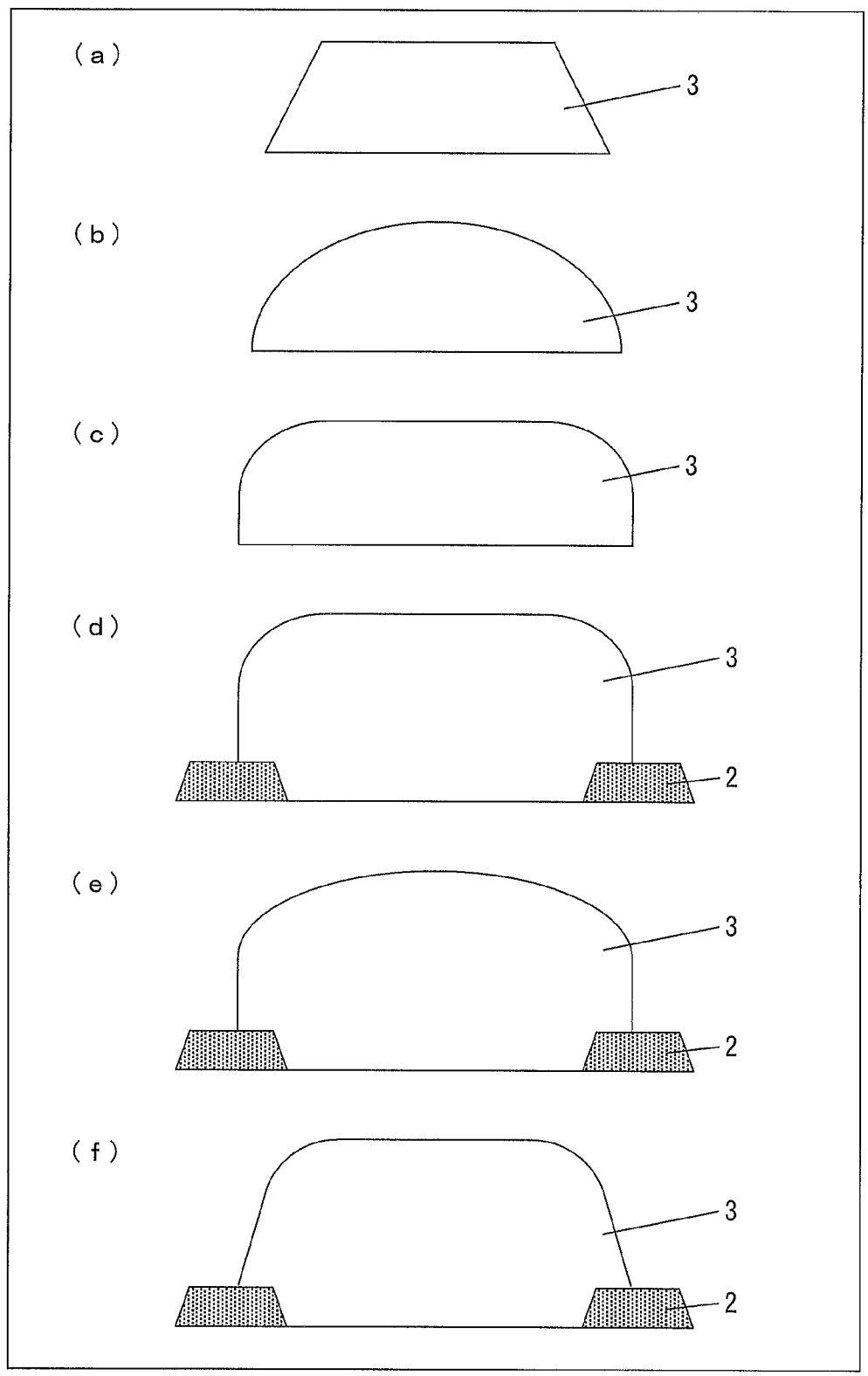
FIG. 2 is a cross sectional view schematically illustrating a shape of a fluorescent layer in accordance with an embodiment of the present invention: (a) through (f) of FIG. 2 schematically illustrate, respectively, various shapes of the fluorescent layer in accordance with the embodiment of the present invention.

FIG. 2 is a cross sectional view schematically illustrating shapes of the fluorescent layer in accordance with the present embodiment. It is preferable that a cross section of the fluorescent layer 3 has a tapered shape (see (a) through (f) of FIG. 2). This allows light emitted toward the side surfaces of the fluorescent layer 3 to be efficiently redirected and extracted to the outside by the reflecting layer 10 (later discussed). In a case where the light-absorbing layer 2 is provided between adjacent ones of the fluorescent layers 3, it is preferable that only a part of the fluorescent layer 3, which part extends upward with respect to the light-absorbing layer 2, has a cross section having a tapered shape (see (d) through (f) of FIG. 2). This makes it possible to efficiently and economically provide the reflecting layer 10, simultaneously, both on the side surface of the fluorescent layer 3 and on a surface of the fluorescent layer 3, which surface is opposite to the light-extraction direction.

It is preferable to flatten the fluorescent layer 3 by use of a planarizing film 42 (later discussed) or the like. With the arrangement, it is possible to prevent formation of a depletion region between the light source 4 (organic EL element) and the fluorescent layer 3, for example. Further, it is also possible to increase adhesiveness between an organic EL element substrate and the fluorescent substrate.

(Light-Absorbing Layer 2)

In the fluorescent substrate 5, the light-absorbing layer 2 is provided between adjacent ones of the fluorescent layers 3. The light-absorbing layer 2 absorbs the light emitted from the fluorescent layer 3. As such, light emitted from a fluorescent layer 3 of one pixel is prevented from leaking to a fluorescent layer 3 of another pixel. This can prevent a reduction in contrast.

The light-absorbing layer 2 generally has a film thickness in a range of about 100 nm to about 100 μm. Note that it is preferable that the film thickness of the light absorbing layer 2 is in a range of 100 nm to 10 μm. Note, also, that it is preferable that the film thickness of the light-absorbing layer 2 is smaller than that of the fluorescent layer 3. This allows the light emitted toward the side surface of the fluorescent layer 3 to be efficiently redirected and extracted to the outside by the reflecting layer 10.

(Reflecting Layer 10)

The reflecting layer 10 is provided so as to cover the side surface(s) of the fluorescent layer 3 and that surface of the fluorescent layer 3 which faces the light source 4 (the excitation light incident surface). The reflecting layer 10 is provided so as to correspond to each fluorescent layer 3. The reflecting layer 10 has such a characteristic that the reflecting layer 10 transmits the excitation light and reflects the light emitted from the fluorescent layer 3. This makes it possible to efficiently extracted, to the outside, the light emitted from the light-emitting layer 3 (see arrows 6 shown in full lines in FIG. 1).

It is preferable that the reflecting layer 10 transmits 80% or more of a component having a peak wavelength of the excitation light and reflects 80% or more of a component having a peak wavelength of the light emitted from the fluorescent layer 3. Hence, the reflecting layer 10 can efficiently transmit the excitation light and efficiently reflect the light emitted from the fluorescent layer 3. This makes it possible to efficiently extracted, in the light-extraction direction, the light emitted from the fluorescent layer 3. It is more preferable that the reflecting layer 10 transmits 90% or more of the component having the peak wavelength of the excitation light and reflects 90% or more of the component having the peak wavelength of the light emitted from the fluorescent layer 3. Hence, the reflecting layer 10 can more efficiently transmit the excitation light and efficiently reflect the light emitted from the fluorescent layer 3. This makes it possible to efficiently extracted, in the light-extraction direction, more light emitted from the fluorescent layer 3.

Concrete examples of the reflecting layer 10 encompass (i) an inorganic material substrate made from a material such as a dielectric multilayer film, a thin film metallic glass, or quartz, and (ii) a plastic substrate made from a material such as polyethylene terephthalate, polycarbazole, or polyimide. However, the reflecting layer 10 is not limited to them.

Note that, if a transmittance of the component having the peak wavelength of the excitation light is 80% or smaller and a reflectance of the component having the peak wavelength of the light emitted from the fluorescent layer 3 is 80% or smaller, provision of the reflecting layer 10 has no influence on efficiency of extracting the light emitted from the fluorescent layer 3. In other words, in this case, no effect can be achieved by providing the reflecting layer 10.

(Good Example of Film Thickness of Reflecting Film 10)

In a case where one of surfaces of the reflecting layer 3 on an excitation light incident side serves as a front surface and the light-output side serves as a back surface, a maximum film thickness of the reflecting film 3 on the side surface(s) of the fluorescent layer is preferably larger than a maximum film thickness of the reflecting film 3 on the front side. With the arrangement, it is possible to maintain the transmittance (at which the excitation light is transmitted into the fluorescent layer 3) of the reflecting layer 10 on the excitation light incident side to be high more efficiently, while causing the light emitted toward the side surface(s) of the fluorescent layer to be returned (reflected) into the fluorescent layer 3. This makes it possible to more efficiently extract, to the outside, light isotropically emitted from the fluorescent layer 3. Accordingly, it is possible to further improve the light-emitting efficiency.

It is preferable that the film thickness of the reflecting film 10 is decreased as being closer to the front side of the reflecting film 10. In fact, excitation light emitted from each excitation light source 4 diffuses at a certain angle. With the arrangement described above, it is possible to maintain the transmittance (at which the excitation light is transmitted into the fluorescent layer 3) of the reflecting layer 10 on the excitation light incident side to be high more efficiently, while causing the diffusing light emitted from the excitation light source 4 provided lateral to the side surface of the fluorescent layer 3 toward the side surface(s) of the fluorescent layer 3 to be returned (reflected) into the fluorescent layer 3. This makes it possible to more efficiently extract, to the outside, the light isotropically emitted from the fluorescent layer 3. Accordingly, it is possible to further improve the light-emitting efficiency.

(Reflecting Layer 10 Containing Gold)

It is preferable that the reflecting layer 10 is a film containing at least gold. Hence, the reflecting film 10 can efficiently transmit the excitation light and efficiently reflect the light emitted from the fluorescent layer 3. This makes it possible to efficiently extract, in the light-extraction direction, the light emitted from the fluorescent layer 3.

Further, it is preferable that a thickness of the reflecting film 10 thus containing at least gold is in a range of 10 nm to 40 nm. With its thickness in this range, the reflecting film 10 thus containing at least gold can exhibit both the characteristic of transmitting the excitation light and the characteristic of reflecting the light emitted from the fluorescent layer 3. This makes it possible to more efficiently extract, to the outside, the light emitted from the fluorescent layer 3. If the thickness of the reflecting film 10 thus containing at least gold is 10 nm or smaller, then there is an improvement in the characteristic of transmitting the excitation light. This allows a larger energy of the excitation light to propagate to the fluorescent layer 3 so that a luminance of the fluorescent material is increased. In this case, however, the characteristic of reflecting the light isotropically emitted from the fluorescent layer 3 becomes low. This results in a reduction in an intensity of light extracted on the light-extraction side. On the other hand, if a thickness of the reflecting film 10 thus containing at least gold is 40 nm or larger, then there is an improvement in the characteristic of reflecting the light isotropically emitted from the fluorescent layer 3 and an improvement in the characteristic of transmitting isotropically-emitted excitation light on the lateral side. This allows a larger energy of the excitation light to propagate to the fluorescent layer 3 so that a luminance of the fluorescent material is increased. However, an intensity of light extracted on the light-extraction side is decreased.

(Color Filter)

It is preferable that color filters (not illustrated) are provided between the fluorescent layer 3 and that surface of the substrate 1 which is close to the light-extraction side (light-extraction surface). The color filters can be conventional red, green, and blue color filters. By proving the red, green, and blue color filters, it is possible to increase chromatic purities of lights emitted from respective red, green, and blue pixels. This can expand a color reproduction range.

The blue color filter, the green color filter, and the red color filter, which are provided on a blue fluorescent layer, a green fluorescent layer, and a red fluorescent layer, respectively, absorb external light (light other than the excitation light emitted from the light source 4) that excites the red fluorescent layer, the green fluorescent layer, and the blue fluorescent layer. This can reduce light emission caused by the external light entering the fluorescent layer 3, or prevent such light emission. Further, this also makes it possible to reduce or prevent a decrease in contrast.

The provision of the blue, green, and red color filters can prevent excitation light, which is not absorbed in the fluorescent layer 3 and transmitted through the fluorescent layer 3, from leaking to the outside. It is thus possible to prevent a reduction in chromatic purities, which reduction is caused by mixing of a color of light emitted from the fluorescent layer 3 and a color of such excitation light.

(Light Source 4)

The light source 4 emits, toward the fluorescent layer 3, the excitation light which excites the fluorescent layer 3. It is preferable that the excitation light is light in an ultraviolet range (ultraviolet light) or light in a blue range (blue light). It is preferable that the ultraviolet light is light whose main emission peak wavelength falls within a range from 360 nm to 410 nm. It is preferable that the blue light is light whose main emission peak wavelength falls within a range from 410 nm to 470 nm.

The light source 4 can be an organic electroluminescence element, an inorganic electroluminescence element, or a light-emitting diode. More specifically, the light source 4 can be an ultraviolet LED, a blue LED, an ultraviolet light-emitting inorganic EL, a blue light-emitting inorganic EL, an ultraviolet light-emitting organic EL, or a blue light-emitting organic EL, for example. However, the light source 4 is not limited to them.

It is preferable that the light source 4 is provided with a sealing film or a sealing substrate. Such a sealing film or a sealing substrate can be made from a known sealing material by a known sealing method. Specifically, for example, the sealing film can be provided by applying a resin to that surface of the fluorescent substrate 5, which faces the light source 4, by a spin coat method, ODF, or a laminate method. The sealing film can be also provided in such a manner that an inorganic film, such as SiO, SiON, SiN, or the like, is provided by a plasma CVD method, an ion plating method, an ion beam method, a sputtering method, or the like. Alternatively, the sealing film can be provided by applying or attaching a resin, by a spin coat method, ODF, or a laminate method, to that surface of the fluorescent substrate 5 which is opposite to the surface facing the light source 4.

In a case where light is extracted from that surface of the fluorescent substrate 5 which is opposite to the surface facing the light source 4, it is necessary for the sealing film and the sealing substrate to be made from a material having optical transparency. Since the sealing film can prevent oxygen or moisture from being mixed in a light-emitting element from the outside, it is possible to extend a lifetime of the light source 4.

By directly switching an on-state and an off-state of the light source 4 with each other, it is possible to control ON/OFF of light emission for displaying an image. It is possible to provide, between the fluorescent layer 3 and the light source 4, a layer having a shutter function (e.g., a liquid crystal layer). By controlling the shutter function of such a layer, it is also possible to control ON/OFF of the light emission for displaying an image. Further, it is even possible to control ON/OFF of the light emission for displaying an image by controlling both the layer having the shutter function and the light source 4.

The light source 4 and the fluorescent substrate 5 can be adhered to each other by use of a conventional UV curable resin, a conventional thermosetting resin, or the like. In a case where the light source 4 is directly provided on the fluorescent substrate 5, an inactive gas, such as a nitrogen gas or an argon gas, is sealed by use of glass or metal. It is preferable to mix a moisture absorbent agent, such as barium oxide, or the like, in the inactive gas thus sealed, because this can more effectively reduce deterioration of the light-emitting element due to moisture.

(Concrete Example of Light Source 4: Organic EL Element)

Figure 3:
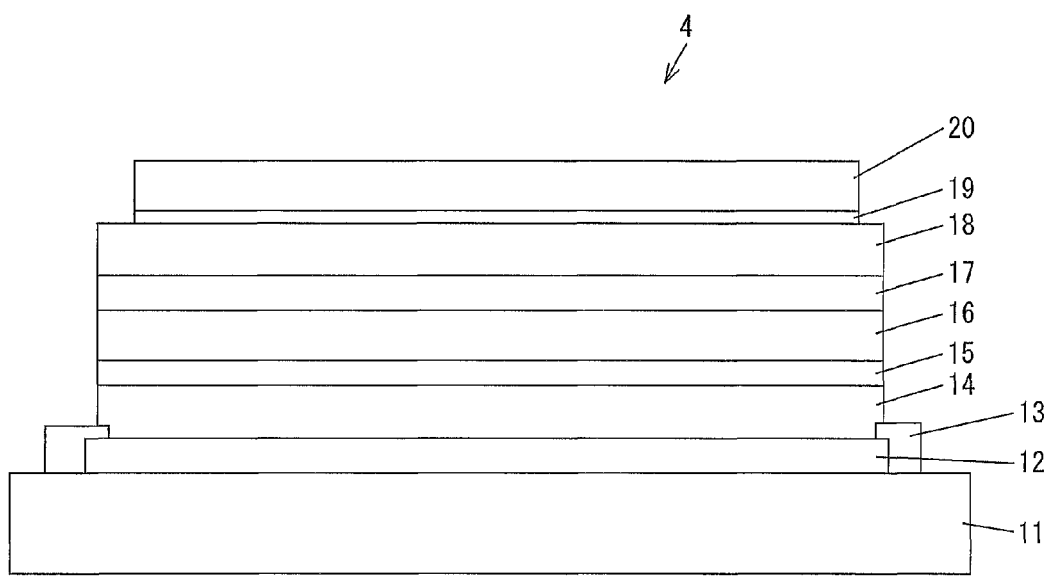
FIG. 3 is a cross sectional view schematically illustrating a configuration example of an LED element serving as a light source.

The light source 4 can be an organic EL element. For example, light source 4 can be a UV light-emitting organic EL or a blue light-emitting organic EL. FIG. 3 is a cross sectional view schematically illustrating an exemplary configuration of an organic EL element serving as the light source 4. The light source 4 illustrated in FIG. 3 includes a substrate 11, an anode 12, an edge cover 13, a hole-injection layer 14, a hole-transport layer 15, a light-emitting layer 16, a hole-blocking layer 17, an electron transport layer 18, an electron-injection layer 19, and a cathode 20.

Specifically, the anode 12, the hole-injection layer 14, the hole transport layer 15, the light-emitting layer 16, the hole-blocking layer 17, the electron transport layer 18, the electron-injection layer 19, and the cathode 20 are stacked in this order on the substrate 11. Note that the edge cover 13 is provided on an edge part of the anode 12. The hole-injection layer 14, the hole transport layer 15, the light-emitting layer 16, the hole-blocking layer 17, the electron-blocking layer, the electron-transport layer 18, and the electron-injection layer 19 can have a single-layer structure or a multi-layer structure.

(Substrate 11)

The substrate 11 is not limited to a specific one, as long as it is a substrate made from an inorganic material, such as glass and quartz, for example. Alternatively, the substrate 11 can be (i) a plastic substrate made from polyethylene terephthalate, polycarbazole, polyimide, or the like, (ii) a ceramics substrate made from alumina or the like, or (iii) a metal substrate made from aluminum (Al), iron (Fe), or the like.

The substrate 11 may be (i) a substrate whose surface is coated with an insulating member made from oxide silicon ($SiO_2$), an organic insulating material, or the like (ii) a metal substrate which is made from Al or the like and whose surface is subjected to an insulation process by a method such as anodic oxidation, (iii) or a like substrate.

It is preferable that the substrate 11 is a plastic substrate or a metal substrate. With such a substrate, a curved section or a folded section can be formed without stress. It is more preferable that the substrate 11 is a plastic substrate coated with an inorganic material or a metal substrate coated with an inorganic insulating material. With such a substrate, it is possible to solve a problem of deterioration of organic EL due to entrance of moisture, which problem is a biggest problem in a case where the plastic substrate is used as a substrate for an organic EL element. Note that it is known that even a small amount of moisture causes deterioration of the organic EL.

A film thickness of the organic EL is significantly small, and is in a range of about 100 nm to about 200 nm. Because of this, it is known that a leakage of a current frequently occurs due to a protrusion in a pixel section. This problem can be solved by using the metal substrate as the substrate for the organic EL element.

(Formation of TFT)

In a case where a thin film transistor (hereinafter, referred to as a "TFT") is formed on the substrate 11, it is preferable that the substrate 11 is neither melted nor deformed at a temperature of 500° C. or lower. A thermal expansion coefficient of a typical metal substrate is different from that of glass. For this reason, it is difficult to provide a TFT on a metal substrate by use of a conventional production device. However, in a case where the metal substrate made from an iron-nickel alloy whose linear coefficient of expansion is $1\times10^{-5}/°$ C. or lower is used and is adjusted to have the linear coefficient of expansion which is identical with that of glass, it becomes possible to provide a TFT on the metal substrate at low cost even with the use of such a conventional production device.

A plastic substrate has a very low upper temperature limit. As such, in a case where a plastic substrate is used as the substrate 11, a TFT is formed on a glass substrate first, and then the TFT thus formed is transferred onto the plastic substrate.

In a case where the light emitted from the organic EL layer is extracted to the outside from a side opposite to a side on which the substrate 11 is provided (substrate-11 side), there is no limitation on the substrate 11. However, in a case where the light emitted from the organic EL element is extracted to the outside from the substrate-11 side, it is necessary to use a transparent substrate or a translucent substrate as the substrate 11.

(TFT)

The TFT is formed on the substrate 11 before the organic EL element is formed on the substrate 11. The TFT functions as both a switching TFT and a driving TFT. The TFT employed in the present invention can be a known TFT. Further, according to the present invention, a metal-insulator-metal (MIM) diode can be used instead of the TFT.

On the substrate 11, the TFT having a known structure can be formed by use of a known material by a known forming method. Examples of a material of an active layer of the TFT encompass an inorganic semiconductor material, an oxide semiconductor material, and an organic semiconductor material. The inorganic semiconductor material can be amorphous silicon, multicrystalline silicon (polysilicon), microcrystal silicon, cadmium selenide, or the like. The oxide semiconductor material can be zinc oxide, indium oxide-gallium oxide-zinc oxide, or the like. The organic semiconductor material can be a polythiophene derivative, a thiophene oligomer, a poly (p-phenylenevinylene) derivative, naphthacene, pentacene, or the like.

The structure of the TFT can be, for example, a staggered TFT structure, an inversely staggered TFT structure, a top gate TFT structure, or a coplanar TFT structure.

A method of forming the active layer of the TFT can be any of the following methods. As a first method, it is possible to employ a method in which amorphous silicon formed by a plasma enhanced chemical vapor deposition (PECVD) method is ion-doped with an impurity. As a second method, it is possible to employ a method in which (i) amorphous silicon is formed by a low pressure chemical vapor deposition (LPCVD) method with the use of a silane ($SiH_4$) gas, (ii) amorphous silicon thus formed is crystallized by a solid phase epitaxy method so as to form polysilicon, and (iii) polysilicon thus formed is ion-doped by an ion implantation method. As a third method, it is possible to employ a method (low temperature process) in which (i) amorphous silicon is formed by an LPCVD method employing an $Si_2HD_6$ gas or a PEDCVD method employing an $SiH_4$ gas, (ii) amorphous silicon thus formed is annealed by use of a laser such as an excimer laser, so that crystallized amorphous silicon forms polysilicon, and (iv) polysilicon is ion-doped. As a fourth method, it is possible to employ a method (high temperature process) in which (i) a polysilicon layer is formed by an LPCVD method or a PECVD method, (ii) a gate insulating film is formed by subjecting the polysilicon layer to heat oxidization at a temperature of 1,000° C. or higher, (iii) a gate electrode 36 made from n+ polysilicon is provided on the gate insulating film, and then (iv) ion doping is carried out. As a fifth method, it is possible to employ a method in which an organic semiconductor material is provided by an ink jet method or the like. As a sixth method, it is possible to employ a method in which a single crystal film is made from an organic semiconductor material. The method of forming the active layer of the TFT is not limited to them and another method can be used.

A gate insulating film of the TFT can be formed by use of a known material. For example, the gate insulating film can be formed by forming $SiO_2$ by a PECVD method or an LPCVD method. Alternatively, the gate insulating film can be formed by forming $SiO_2$ by causing a polysilicon film to be subjected to thermal oxidization. A method of forming the gate insulating film of the TFT is not limited to them and another method can be used.

A signal electrode line, a scanning electrode line, a common electrode line, a first driving electrode, and a second driving electrode of the TFT can be formed by use of known materials. For example, materials of the lines and electrodes described above can be tantalum (Ta), aluminum (Al), copper (Cu), and the like.

The TFT formed on the substrate 11 is not limited to the materials, the structures, and the forming methods described above.

(Interlayer Insulating Film)

An interlayer insulating film can be formed by use of a known material (an inorganic material or an organic material). The inorganic material can be, for example, silicon oxide ($SiO_2$), silicon nitride (SiN or $Si_2N_4$), tantalum oxide (TaO or $Ta_2O_5$), or the like. The organic material can be an acrylate resin, a resist material, or the like.

A method for forming the interlayer insulating film can be (i) a dry process such as a chemical vapor deposition (CVD) method, a vacuum deposition method, or the like, or (ii) a wet process such as a spin coat method or the like. Patterning may be carried out by a photolithography method, if necessary.

In a case where light emitted from the organic EL layer is extracted from a side (second electrode side) opposite to the substrate-11 side, it is preferable that an insulating film having a light blocking effect is used. With the arrangement, it is possible to prevent external light from entering the TFT formed on the substrate 11 and changing characteristics of the TFT. Note that it is possible to use a combination of a normal insulating film and an insulating film having a light blocking effect.

An interlayer insulating film having a light blocking effect can be such a layer that a pigment or a dye, such as phthalocyanine and quinacrodon, is dispersed in a polymer resin such as polyimide. Alternatively, the interlayer insulating film can be made from an inorganic insulating material such as a color resist, a black matrix material, and $NixZnyFe_2O_4$. However, the interlayer insulating film is not limited to these materials and these forming methods.

(Planarizing Film)

In a case where a TFT and the like are formed on the substrate 11, there are concavities and convexities on a surface of the substrate 11. The concavities and convexities on the surface of the substrate 11 might cause a defect of the organic EL element. Examples of such a defect encompass a deficit of a pixel electrode, a deficit of an organic EL layer, disconnection of a counter electrode, a short circuit between the pixel electrode and a common electrode, and a decrease in a withstand voltage. In order to prevent such defects, it is possible to provide the planarizing layer on the interlayer insulating film.

The planarizing layer can be formed by use of a known material. For example, the planarizing layer can be made from (i) an inorganic material such as silicon oxide, silicon nitride, or tantalum oxide, or (ii) an organic material such as polyimide, an acrylate resin, or a resist material. A method of forming the planarizing layer can be (i) a dry process such as a CVD method or a vacuum deposition method, or (ii) a wet process such as a spin coat method. However, the planarizing layer is not limited to these materials and these forming methods. The planarizing layer can have a single-layer structure or a multi-layer structure.

(Anode 12 and Cathode 20)

A first electrode and a second electrode used in the present invention serves as a pair of electrodes, namely, the anode 12 and the cathode 20 of the organic EL element. That is, in a case where the first electrode serves as the anode 12, the second electrode serves as the cathode 20. On the other hand, in a case where the first electrode serves as the cathode 20, the second electrode serves as the anode 12. The following description discusses (i) specific compounds from which the anode 12 and the cathode 20 are made and (ii) specific methods of forming the anode 12 and the cathode 20. However, neither the anode 12 nor the cathode 20 is limited to them.

The anode 12 can be made from a known electrode material. Specifically, examples of a transparent electrode material encompass (i) a metal whose work function is 4.5 eV or larger, such as gold (Au), platinum (Pt), or nickel (Ni), (ii) an oxide (ITO) made from indium (In) and tin (Sn), and (iii) an oxide (IZO) made from oxide ($SnO_2$) indium (In) of tin (Sn) and zinc (Zn). In a case where the anode 12 is made from such a material, it is possible to carry out injection of a hole into the organic EL layer more efficiently.

The cathode 20 can be made from a known electrode material. Specifically, The electrode material can be (i) a metal whose work function is 4.5 eV or smaller, such as lithium (Li), calcium (Ca), cerium (Ce), barium (Ba), or aluminum (Al) or (ii) an alloy of these metals, such as an Mg:Ag alloy or an Li:Al alloy. Each of these electrode materials can more increase an efficiency of electron injection into the organic EL layer.

Each of the anode 12 and the cathode 20 can be formed from any of the above listed materials by a known method such as an EB vapor-deposition method, a sputtering method, an ion planting method, or a resistance heating vapor-deposition method. However, neither the anode 12 nor the cathode 20 is limited to them. If necessary, the electrodes thus formed can be patterned by a photolithography method or a laser removing method. Further, by using a shadow mask in the photolithography method or the laser removing method, it is possible to form directly patterned electrodes. It is preferable that the anode 12 and the cathode 20 have a film thickness of 50 nm or larger. In a case where the thicknesses of the anode 12 and the cathode 20 are less than 50 nm, there is an increase in a resistance of a wiring. This gives rise to a risk that there might be an increase in driving voltage.

The anode 12 and the cathode 20 can constitute a microcavity structure. This can improve a chromatic purity, a light-emitting efficiency, a luminance on a front side, and the like. In a case where the microcavity structure is employed and light emitted from the organic EL layer is extracted from the anode 12, it is preferable that the anode 12 is a translucent electrode. On the other hand, in a case where the microcavity structure is employed and the light emitted from the organic EL layer is extracted from the cathode 20, it is preferable that the cathode 20 is a translucent electrode. In either case, the anode 12 (the cathode 20) can be made from a metal translucent electrode alone or a combination of the metal translucent electrode and a transparent electrode material. It is preferable, from a perspective of a reflectance and a transmittance, that the translucent electrode material is silver. It is preferable that the translucent electrode has a film thickness in a range of 5 nm to 30 nm. In a case where the film thickness of the translucent electrode is less than 5 nm, reflection of the light becomes insufficient. This makes it impossible to obtain an interference effect sufficiently. In contrast, in a case where the film thickness of the translucent electrode is larger than 30 nm, there is a drastic decrease in light transmittance. This gives rise to a risk that there might be a decrease in luminance of emitted light and light-emitting efficiency.

It is preferable to use, as the anode 12, an electrode having a high light reflectance (this also applies to the cathode 20). For example, such an electrode can be (i) a reflective metal electrode made from aluminum, silver, gold, an aluminum-lithium alloy, an aluminum-neodymium alloy, or an aluminum-silicone alloy or (ii) such an electrode that a transparent electrode and a reflective metal electrode (reflective electrode) are combined with each other.

(Edge Cover 13)

It is preferable that the edge cover 13 is provided between the anode 12 and the cathode 20 so as to cover the edge part of the anode 12. This can prevent generation of a leakage between the anode 12 and the cathode 20. The edge cover 13 can be formed, by use of an insulating material, by a known method such as an EB vapor-deposition method, a sputtering method, an ion plating method, or a resistance heating vapor-deposition method. Patterning of the edge cover 13 can be carried out by a known dry photolithography method or a known wet photolithography method. However, a method of forming the edge cover 13 is not limited to these.

The insulating material of the edge cover 13 can be a known material. Such an insulating material is not particularly limited, as long as the insulating material transmits light. Examples of the insulating material encompass SiO, SiON, SiN, SiOC, SiC, HfSiON, ZrO, HfO, and LaO.

It is preferable that the edge cover 13 has a film thickness in a range of 100 nm to 2000 nm. In a case where the film thickness of the edge cover 13 is 100 nm or smaller, an insulating property of the edge cover 13 is insufficient. As such, a leakage occurs between the anode 12 and the cathode 20. This causes (i) an increase in power consumption and (ii) such a defect that no light is emitted. In contrast, in a case where the film thickness of the edge cover 13 is 2,000 nm or larger, a time period necessary to carry out a process for forming a film becomes long. This causes (i) a reduction in productivity and (ii) disconnection of the cathode 20 at the edge cover.

It is preferable that the organic EL element thus used as the light source 4 has a microcavity structure (optical microresonator structure). The microcavity structure is realized in such a manner that (i) one of the anode 12 and the cathode 20 serves as a reflecting electrode, (ii) the other of the anode 12 and the cathode 20 serves as a translucent electrode, and (iii) an interference effect between the reflecting electrode and the translucent electrode is obtained. Alternatively, the microcavity structure can be realized by a dielectric multilayer film. With the microcavity structure, it is possible to concentrate, in a front direction, light emitted from the organic EL element (i.e., it is possible to cause light emitted from the organic EL element to have a directivity). This can decrease a loss of light emitted to directions other than the front direction, and can increase the light-emitting efficiency in the front direction. As such, it is possible to propagate light-emitting energy generated by a light-emitting layer of the organic EL element to the fluorescent layer more efficiently. Further, it is also possible to enhance a luminance in the front direction.

Further, by the interference effect of the microcavity structure, it is possible to adjust (i) a peak wavelength of the light thus emitted to a desired value and (ii) a half bandwidth of the light thus emitted to a desired value. This can adjust a light spectrum of the light thus emitted. For example, the light spectrum is adjusted to a spectrum which can more effectively excite the red fluorescent layer and the green fluorescent layer. This can increase a chromatic purity in the blue pixel.

(Hole Injection Layer 14 and Hole Transport layer 15)

Examples of materials of the hole injection layer 14 and the hole transport layer 15 encompass (i) a low-molecular material such as an oxide (such as vanadium oxide ($V_2O_5$) and molybdenum oxide ($M_oO_2$)), an inorganic p-type semiconductor material, an aromatic tertiary amine compound (such as porphyrin compound, N,N'-bis(3-methylphenyl)-N,N'-bis(phenyl)-benzidine (TPD), and N,N'-di (naphthalene-1-yl)-N,N'-diphenyl-benzidine (NPD)), a hydrazone compound, a quinacridone compound, and a styrylamine compound, and (ii) a polymer material such as polyaniline (PANI), polyaniline-camphorated sulfo acid (PANI-CSA), 3,4-polyethylenedioxithiophene/polystyrene sulfonate (PEDOT/PSS), poly (triphenylamine) derivative (Poly-TPD), polyvinyl carbazole (PVCz), poly (p-phenylenevinylene) (PPV), and poly (p-naphthalenevinylene) (PNV).

It is preferable that the material of the hole injection layer 14 has a lower energy level of a highest occupied molecular orbital (HOMO) than that of a highest occupied molecular orbital (HOMO) of the material of the hole transport layer 15. With the arrangement, it becomes possible to carry out injection and transport of a hole from the anode 12 more efficiently. It is preferable that the material of the hole transport layer 15 has a higher hole mobility than that of the material of the hole injection layer 14. It is preferable that the hole injection material and the hole transport material are doped with acceptors. This can further improve a hole injection property and a hole transport property. The acceptors can be made from a known acceptor material for the organic EL. Examples of the acceptor material encompass concrete compounds listed below. Note, however, that the acceptor material is not limited to these.

Examples of the acceptor material encompass (i) an inorganic material such as Au, Pt, W, Ir, $POCl_3$, $AsF_6$, CL, Br, I, vanadium oxide ($V_2O_5$), or molybdenum oxide ($MoO_2$), and (ii) an organic material such as a compound including a cyano group (such as TCNQ (7,7,8,8,-tetracyanoquinodimethan), $TCNQF_4$ (tetrafluorotetracyanoquinodimethan), TCNE(tetracyanoethylene), HCNB (hexacyanobutadiene), and DDQ (dicyclodicyanobenzoquinone)), a compound including a nitro group (such as TNF (trinitroflorene) and DNF (dinitroflorene)), fluoranil, chloranil, and bromanil. Particularly, the compound including a cyano group, such as TCNQ, $TCNQF_4$, TCNE, HCNB, and DDQ, is preferable because it can more effectively increase a carrier concentration.

(Light-Emitting Layer 16)

The light-emitting layer 16 is not limited to a specific one, as long as it is made from only an organic light-emitting material, examples of which are described below. The light-emitting layer 16 can be also made from a combination of a luminescent dopant and a host material. Further, the light-emitting layer 16 can optionally contain a hole injection material, a hole transport material, an additive agent (such as a donor, an acceptor, etc.), and/or the like. The light-emitting layer 16 can have an arrangement in which these materials are dispersed in a polymer material (binder resin) or an inorganic material. It is preferable, from a perspective of light-emitting efficiency and a lifetime of the light-emitting layer 16, that the light-emitting layer 16 is such that a light-emitting dopant is dispersed in a host material.

The organic light-emitting material can be a known light-emitting material for the organic EL element. Such a light-emitting material is classified into a low-molecular light-emitting material, a polymer light-emitting material, or the like. Specific examples of such a light-emitting compound are listed below, but the light-emitting material is not limited to these. The light-emitting material may be the one classified into a fluorescent material, a phosphorescent material, or the like. In view of a reduction in power consumption, it is preferable that the light-emitting material is a phosphorescent material having a high light-emitting efficiency. Specific compounds are described below as examples. Note, however, that the light-emitting material is not limited to these.

The light-emitting dopant which is optionally contained in the light-emitting layer 16 can be a known dopant material for the organic EL element. For example, an ultraviolet light-emitting material can be a fluorescent light-emitting material such as p-quarterphenyl, 3,5,3,5tetra-t-butylsexiphenyl, or 3,5,3,5tetra-t-butyl-p-quinquephenyl. For example, a blue light-emitting material can be (i) a fluorescent light-emitting material such as a styryl derivative, or (ii) a phosphorescent light-emitting organic metal complex such as bis[(4,6-difluorophenyl)-pyridinato-N,C2'] picolinate iridium (III) (Flrpic) or bis(4',6'-difluorophenylpolydinato) tetrakis (1-pyrazole) borate iridium (III) (Flr6).

The host material used with the dopant can be a known host material for the organic EL element. Such a host material can be (i) the low-molecular light-emitting material described above, (ii) the polymer light-emitting material described above, (iii) a carbazole derivative such as 4,4'-bis (carbazole) biphenyl, 9,9-di (4-dicarbazole-benzil) florene (CPF), 3,6-bis (triphenylsilyl) carbazole (mCP), or (PCF), (iv) an aniline derivative such as 4-(diphenylphosphoyl)-N,N-diphenylaniline (HM-A1), or (v) a fluorene derivative such as 1,3-bis (9-phenyl-9H-fluorene-9-yl) benzene (mDPFB) or 1,4-bis(9-phenyl-9H-fluorene-9-yl) benzene (pDPFB).

(Electric Charge Injection/Transport Layers 18 and 19)

Electric charge injection/transport layers 18 and 19 are classified into an electron injection layer 19 and an electron transport layer 18 in order to more efficiently carry out injection of an electron from the cathode 20 and transport (injection) of the electron to the light-emitting layer 16. The electron injection layer 19 and the electron transport layer 18 are made from only electron injection/transport material, examples of which are described below. Further, the electron injection layer 19 and the electron transport layer 18 can optionally contain an additive (a donor, an acceptor, etc.). Furthermore, the electron injection layer 19 and the electron transport layer 18 can have such an arrangement that these materials are dispersed in a polymer material (binder resin) or in an inorganic material.

The electron injection/transport material can be a known electron transport material for the organic EL or an organic photoconductor. Such an electron injection/transport material is categorized into a hole injection/transport material, or an electron injection/transport material. Specific examples of such an electron injection/transport material are described below. Note, however, that the electron injection/transport material is not limited to these.

For example, each of the electron injection material and the electron transport material can be (i) a low-molecular material such as (i-i) an inorganic material that is an n-type semiconductor, (i-ii) an oxadiazole derivative, (i-iii) a triazole derivative, (i-iv) a thiopyrazindioxide derivative, (i-v) a benzoquinone derivative, (i-vi) a naphthoquinone derivative, (i-vii) an anthraquinone derivative, (i-viii) a diphenoquinone derivative, (i-ix) a fluorenone derivative, or (i-x) a benzodifuran derivative, or (ii) high-polymer materials such as poly (oxadiazole) (Poly-OXZ) or a polystyrene derivative (PSS). Particularly, the electron injection material can be a fluoride such as lithium fluoride (LiF) or barium fluoride (BaF$_2$), or an oxide such as lithium oxide (Li$_2$O).

It is preferable that the material of the electron injection layer 19 has a higher energy level in a lowest unoccupied molecular orbital (LUMO) than that of a lowest unoccupied molecular orbital (LUMO) of the material of the electron transport layer 18. This makes it possible to carry out the injection/transport of an electron from the cathode 20 more efficiently. It is preferable that the material of the electron transport layer 18 has a higher electron mobility than that of the material of the electron injection layer 19. It is preferable that the electron injection material and the electron transport material are doped with a donor. This can further improve an electron injection property and an electron transport property. The donor can be a known donor material for the organic EL. Specific compounds are described below as examples of the donor. Note, however, that the donor is not limited to these.

Examples of the donor material encompass (i) an inorganic material such as alkali metal, alkali earth metal, rare earth element, Al, Ag, Cu, and In, and (ii) an organic material such as a compound whose skeleton is aromatic tertiary amine (such as aniline, phenylenediamine, benzidine (such as N,N, N',N'-tetraphenylbenzidine, N,N'-bis-(3-methylphenyl)-N, N'-bis-(phenyl)-benzidine, and N,N'-di(naphthalene-1-yl)-N,N'-diphenyl-benzidine), triphenylamine (such as triphenylamine, 4,4'4"-tris(N,N-diphenyl-amino)-triphenylamine), 4 4'4"-tris (N-3-methylphenyl-N-phenyl-amino)-triphenylamine, and 4,4',4"-tris(N-(1-naphthyl)-N-phenyl-amino)-triphenylamine), triphenyldiamine (such as N,N'-di-(4-methyl-phenyl)-N,N'-diphenyl-1,4-phenylenediamine)), a condensed polycyclic compound (such as phenanthrene, pyrene, perylene, anthracene, tetracene, and pentacene) (note that a condensed polycyclic compound may have a substituent group), TTF (tetrathiafulvalene), dibenzofuran, phenothiazine, carbazole, and the like. Particularly, it is preferable that the donor material is a compound whose skeleton is aromatic tertiary amine, a condensed polycyclic compound, or alkali metal. With such a donor material, it is possible to effectively increase a carrier concentration.

(Method of Forming Each of Layers Described Above)

The organic EL layers, such as the hole injection layer 14, the hole transport layer 15, the light-emitting layer 16, the electron transport layer 18, and the electron injection layer 19, can be formed by various methods. For example, each of these can be formed, by use of coating solution for forming an organic EL layer in which coating solution any of the materials described above is dissolved and dispersed in a solvent, by a known wet process such as (i) a coating method (such as a spin coating method, a dipping method, a doctor blade method, a discharge method, or a spray coat method), or (ii) a printing method such as an ink jet method, a relief printing method, an intaglio printing method, a screen printing method, or a micro gravure coat method. Alternatively, each of the organic EL layers can be formed, by use of any of the materials described above, by (i) a known dry process such as a resistance heating vapor-deposition method, an electron beam (EB) vapor-deposition method, a molecular beam epitaxy (MBE) method, a sputtering method, or an organic vapor phase deposition (OVPD) method, or (ii) a laser transfer method or the like. In a case where the organic EL layer is formed by the wet process, the coating solution may contain a leveling agent or an additive agent, such as a viscosity controller agent, for controlling a property of the coating solution.

A film thickness of each organic EL layer is generally in a range of about 1 nm to about 1,000 nm. Note that it is preferable that the film thickness of each organic EL layer is in a range of 10 nm to 200 nm. In a case where the thickness of each organic EL layer is smaller than 10 nm, it is impossible to obtain properties (electron injection property, electron transport property, electron containment property) which are originally required. Further, there is a risk that a pixel has a defect due to a foreign matter such as dust. In contrast, in a case where the film thickness of each organic EL layer is larger than 200 nm, there is an increase in driving voltage due to a resistance component of the organic EL layer. This causes an increase in power consumption.

(Other Layer Arrangement)

The light source 4 illustrated in FIG. 3 includes the hole injection layer 14, the hole transport layer 15, the light-emitting layer 16, the hole blocking layer 17, the electron transport layer 18, and the electron injection layer 19. However, the light source 4 is not limited to this arrangement. For example, the light source 4 can be configured as described in any of the following arrangements (1) through (9):

(1) organic light-emitting layer;
(2) hole transport layer/organic light-emitting layer;
(3) organic light-emitting layer/electron transport layer;
(4) hole transport layer/organic light-emitting layer/electron transport layer;
(5) hole injection layer/hole transport layer/organic light-emitting layer/electron transport layer;
(6) hole injection layer/hole transport layer/organic light-emitting layer/electron transport layer/electron injection layer;
(7) hole injection layer/hole transport layer/organic light-emitting layer/hole blocking layer/electron transport layer;
(8) hole injection layer/hole transport layer/organic light-emitting layer/hole blocking layer/electron transport layer/electron injection layer; and
(9) hole injection layer/hole transport layer/electron blocking layer/organic light-emitting layer/hole blocking layer/electron transport layer/electron injection layer.

(Arrangement of Display Device 50)

Figure 4:
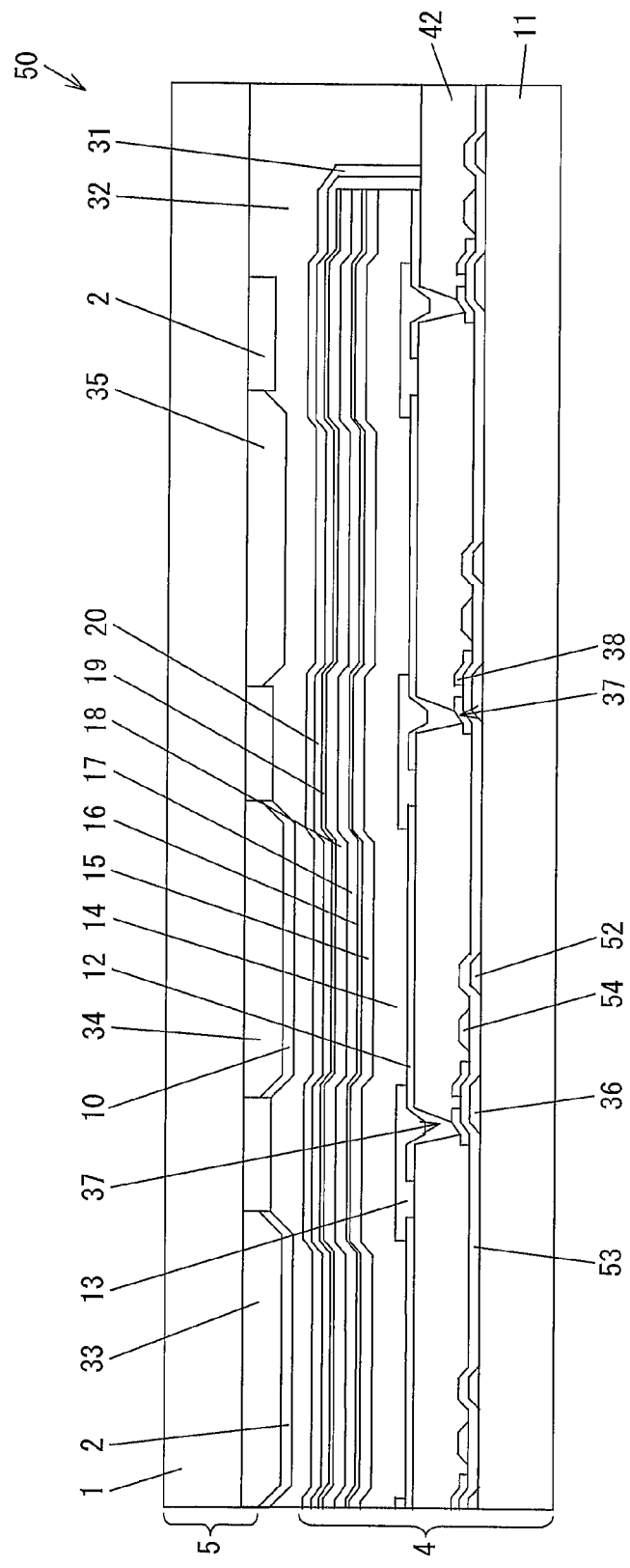
FIG. 4 is a cross sectional view schematically illustrating a configuration example of an organic EL element serving as the light source.

The display device 50 thus described is realized as an organic EL display 50 of an active matrix driving type, illustrated in FIG. 4. FIG. 4 is a cross sectional view schematically illustrating one exemplary configuration of the organic EL display 50 of the active matrix driving type. The display device 50 illustrated in FIG. 4 is mainly constituted by a fluorescent substrate 5 illustrated in FIG. 1 and a light source 4 illustrated in FIG. 3. The display device 50 further includes an inorganic sealing film 31, a resin sealing film 32, a red light-emitting fluorescent layer 33, a green light-emitting fluorescent layer 34, a light-scattering layer 35, a gate electrode 36, a drain electrode 37, a source electrode 38, a p-type contact layer 51, a gate line 52, an interlayer insulating film 53, and a source line 54.

(Concrete Example of Light Source 4: LED Element)

Figure 5:
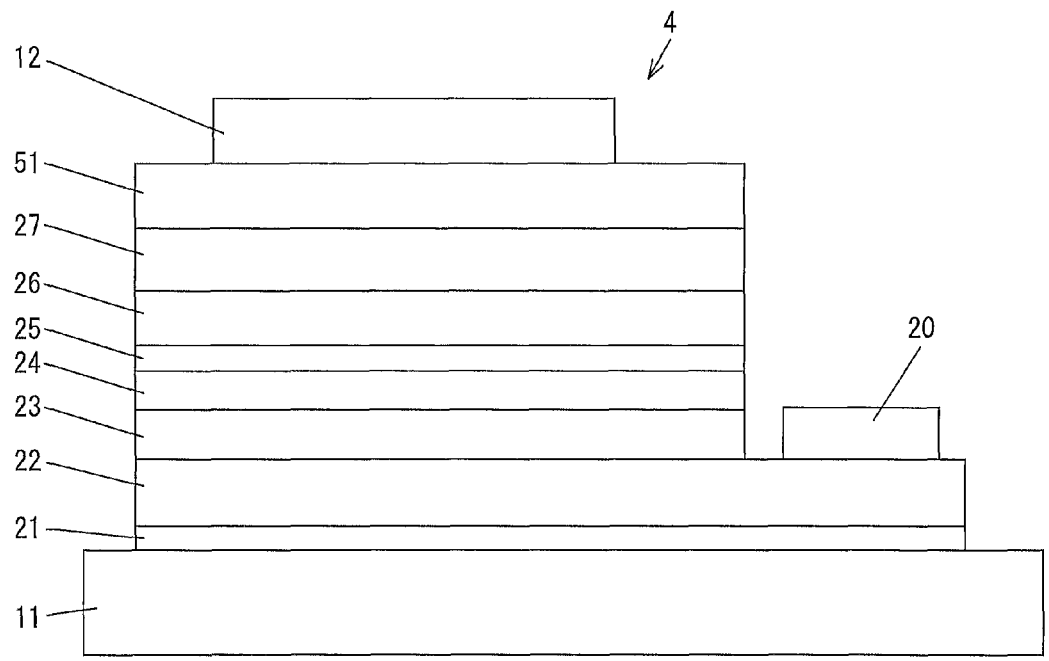
FIG. 5 is a cross sectional view schematically illustrating a configuration example of an active matrix driving organic EL display device.

In the present invention, the light source 4 can be an LED element. For example, the light source 4 can be an ultraviolet LED or a blue LED. FIG. 5 is a cross sectional view schematically illustrating an exemplary arrangement of the LED element serving as the light source 4. The light source 4 illustrated in FIG. 5 includes a substrate 11, an anode 12, a cathode 20, a buffer layer 21, an n-type contact layer 22, n-type clad layers 23 and 24, an active layer 25, p-type clad layers 26 and 27, and a p-type contact layer 51.

Specifically, the buffer layer 21 and the n-type contact layer 22 are stacked on the substrate 11. The cathode 20 and the second n-type clad layer 23 are provided on the n-type contact layer 22. The first n-type clad layer 24, the active layer 25, the first p-type clad layer 26, the second p-type clad layer 27, the p-type contact layer 51, and the anode 12 are stacked in this order on the second n-type clad layer 23.

(Substrate 11)

The substrate 11 is a substrate made from inorganic material such as glass and quartz, for example. The substrate 11 can be (i) a plastic substrate made from polyethylene terephthalate, polycarbazole, polyimide, or the like. Further, the substrate 11 can be a ceramics substrate made from alumina or the like. Furthermore, the substrate 11 can be a metal substrate made from aluminum (Al), iron (Fe), or the like. The substrate 11 can be such a substrate that a surface of the substrate is coated with an insulating material such as silicon oxide ($SiO_2$) or an organic insulating material. Moreover, the substrate 11 can be such a substrate that a surface of a metal substrate made from Al or the like is subjected to an insulation process by a method such as anode oxidation.

(N-Type Clad Layers 23 and 24)

The n-type clad layers 23 and 24 can be made from a known n-type clad layer material for an LED. Each of the n-type clad layers 23 and 24 can have either a single-layer structure or a multi-layer structure. The n-type clad layers 23 and 24 can be made from a material prepared from an n-type semiconductor whose bandgap energy is larger than that of the active layer 25. This arrangement generates an electric potential barrier against holes between (i) the n-type clad layers 23 and 24 and (ii) the active layer 25. It becomes therefore possible to keep holes in the active layer 25. The n-type clad layers 23 and 24 can be made from n-type $In_x Ga_{1-x}N$ ($0 \leq x < 1$), for example. Note, however, that the n-type clad layers 23 and 24 are not limited to this.

(Active Layer 25)

The active layer 25 emits light by recombination of holes and electrons. The active layer 25 can be made from a known active layer material for an LED. Examples of the material of the active layer 25 encompass an ultraviolet active layer material and a blue active layer material. The ultraviolet active layer material can be AlGaN, InAlN, or $In_a Al_b Ga_{1-a-b}N$ ($0 \leq a$, $0 \leq b$, $a+b \leq 1$). The blue active layer material can be $In_z Ga_{1-z}N$ ($0 < z < 1$) or the like. However, the active layer 25 is not limited to them.

The active layer 25 has a single quantum well structure or a multiquantum well structure. The active layer 25 thus having such a quantum well structure can be of an n-type or a p-type. Particularly, it is preferable that the active layer 25 is non-doped (no impurity is added). In this case, a half bandwidth of a wavelength of the light thus emitted becomes narrow due to light emitted between bands, so that it is possible to obtain light thus emitted, which light has a high chromatic purity.

The active layer 25 may be doped with one or both of a donor impurity and an acceptor impurity. If a crystalline property of the active layer 25 doped with an impurity is identical with that of the active layer 25 doped with no impurity, and the active layer 25 is doped with a donor impurity, it is possible to further increase an intensity of the light emitted between bands, as compared with the active layer 25 which is dopes with no impurity. In a case where the active layer 25 is doped with an acceptor impurity, it is possible to cause a peak wavelength of the active layer 25 to be shifted toward a low energy side by about 0.5 eV with respect to a peak wavelength of interband light emission. Note, however, that, in this case, a half bandwidth of the active layer 25 becomes wide. In a case where the active layer 25 is doped with both the acceptor impurity and the donor impurity, it becomes possible to further enhance intensity of the light thus emitted, as compared with that of the light obtained with the active layer doped with only the acceptor impurity. Particularly, in a case where the active layer 25 is doped with the acceptor impurity, it is preferable that the active layer 25 is doped with the donor impurity such as Si or the like so that a conductive type of the active layer 25 becomes an n type.

(P-type Clad Layers 26 and 26)

The p-type clad layers 26 and 27 can be made from a known p-type clad layer material for an LED. Each of the p-type clad layers 26 and 27 can have a single-layer structure or a multi-layer structure. The p-type clad layers 26 and 27 can be made from a material prepared from a p-type semiconductor whose bandgap energy is larger than that of the active layer 25. An electric potential barrier against electrons is formed between (i) the p-type clad layers 26 and 27 and (ii) the active layer 25. This makes it possible to keep electrons in the active layer 25. The p-type clad layers 26 and 27 can be made from $Al_yGa_{1-y}N$ ($0 \leq y \leq 1$), for example. Note, however, that the material of the p-type clad layers 26 and 27 is note limited to this.

(Contact Layers 22 and 51)

The contact layers 22 and 51 can be made from a known contact layer material for an LED. For example, an n-type contact layer 22 can be made from n-type GaN. The p-type contact layer 51 can be made from p-type GaN, for example. In a case where the second n-type clad layer and the second p-type clad layer are made from GaN, it is not necessary to provide the contact layers 22 and 51. In this case, the second n-type clad layer and the second p-type clad layer serve as the contact layers 22 and 51.

The layers thus described can be formed by use of known film forming process for an LED. Note, however, that the present invention is not limited to this. For example, the layers can be formed on a substrate made from materials such as sapphire (including C, A, and R surfaces), SiC (including 6H—SiC, 4H—SiC), spinel ($MgAl_2O_4$, (111) surface of it in particular), ZnO, Si, or GaAs, or another oxide monocrystalline substrate (such as NGO), by use of a vapor growth method such as MOVPE (metal organic vapor phase epitaxy), MBE (molecular beam epitaxy), or HDVPE (hydride vapor phase epitaxy).

(Inorganic EL Element)

Figure 6:
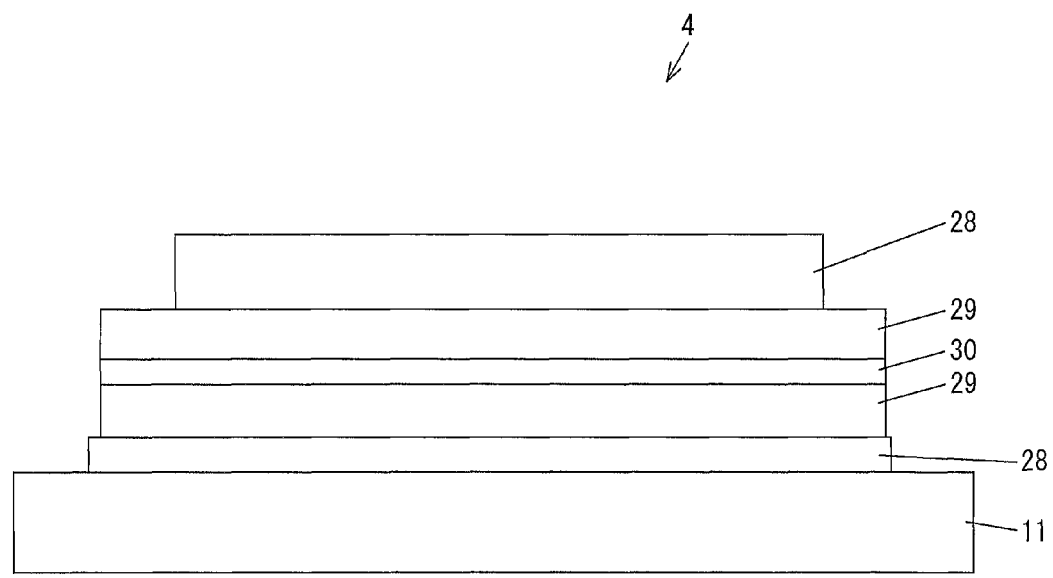
FIG. 6 is a cross sectional view schematically illustrating a configuration example of an inorganic EL element serving as a light source.

It is possible to use an inorganic EL element as the light source 4. For example, it is possible to use an ultraviolet light-emitting inorganic EL or a blue light-emitting inorganic EL as the light source 4. FIG. 6 is a cross sectional view schematically illustrating an example of an arrangement of the inorganic EL element serving as the light source 4. The light source 4 includes a substrate 11, an electrode 28, a dielectric layer 29, and a light-emitting layer 30 (see FIG. 6). Specifically, the electrode 28, the dielectric layer 29, the light-emitting layer 30, another dielectric layer 29, and another electrode 28 are stacked in this order on the substrate 11.

(Substrate 11)

The substrate 11 is a substrate made from an inorganic material such as glass or quartz. The substrate 11 can be (i) a plastic substrate made from a material such as polyethylene terephthalate, polycarbazole, polyimide, or the like. The substrate 11 can be a ceramics substrate made from a material such as alumina. The substrate 11 can be a metal substrate made from a material such as aluminum (A) or iron (Fe).

The substrate 11 can be such a substrate that a surface of the substrate is coated with an insulating material made from silicon oxide ($SiO_2$), an organic insulating material, or the like. Alternatively, the substrate 11 can be such a substrate that a surface of a metal substrate made from Al or the like is subjected to an insulating process by a method such as anode oxidation.

It is preferable to use a plastic substrate or a metal substrate as the substrate 11. In a case of using the plastic substrate or the metal substrate as the substrate 11, it is possible to form a curved section or a bending section without any stress.

(Electrodes 28)

The electrode 28 is formed by use of a transparent electrode material. The transparent electrode material can be a metal such as aluminum (Al), gold (Au), platinum (Pt), or nickel (Ni). Other than these, examples of the transparent electrode material encompass an oxide (ITO) made from indium (In) and tin (Sn), and an oxide (IZO) made from an oxide ($SnO_2$) of tin (Sn), indium (In), and zinc (Zn). However, the transparent electrode material is not limited to these. It is preferable that a transparent electrode, made from a material such as ITO, is provided in the light-extraction direction. On the other hand, it is preferable that a reflecting film, made from a material such as aluminum, is used on a side opposite to the light-extraction side.

The electrode 28 can be formed by use of any of the materials described above, by a known method such as an EB vapor-deposition method, a sputtering method, an ion plating method, or a resistance heating vapor-deposition method. However, a method for forming the electrode 28 is not limited to these. It is possible to carry out, by a photolithography method or a laser removing method, patterning with respect to the electrode thus formed. By the photolithography method or the laser removing method with the use of a shadow mask, it is possible to form directly a patterned electrode. It is preferable that a film thickness of the electrode 28 is 50 nm or larger. In a case where the film thickness of the electrode 28 is smaller than 50 nm, there is an increase in a resistance of a wiring. This generates a risk that there might be an increase in driving voltage.

(Dielectric Layer 29)

The dielectric layer 29 can be formed by use of a known dielectric material for an inorganic EL element. Examples of the dielectric material encompass tantalum pentoxide ($Ta_2O_5$), silicon oxide ($SiO_2$), silicon nitride ($Si_3N_4$), aluminum oxide ($Al_2O_3$), aluminum titanate ($AlTiO_3$), barium titanate ($BaTiO_3$), and strontium titanate ($SrTiO_3$). However, the dielectric material is not limited to these.

The dielectric layer 29 can be made from a selected one (1) of dielectric materials thus listed or can be formed in such a manner that at least two materials among the materials described above are stacked with each other. It is preferable that a film thickness of the dielectric layer 29 is in a range of about 200 nm to about 500 nm.

(Light-Emitting Layer 30)

The light-emitting layer 30 can be made from a known light-emitting material for an inorganic EL element. Such a light-emitting material is categorized into an ultraviolet light-emitting material or a blue light-emitting material. The ultraviolet light-emitting material may be $ZnF_2$:Gd. The blue light-emitting element may be $BaAl_2S_4$:Eu, $CaAl_2S_4$:Eu, $ZnAl_2S_4$:Eu, $Ba_2SiS_4$:Ce, ZnS:Tm, SrS:Ce, Srs:Cu, CaS:Pb, or $(Ba, Mg)Al_2S_4$:Eu. However, the present invention is not limited to these. It is preferable that a film thickness of the light-emitting layer 30 is in a range of about 300 nm to about 1,000 nm.

The LED element, the inorganic EL element, or the organic EL element, serving as the light source 4, is directly connected to an external circuit electrically, and is directly driven. Alternatively, an active element (switching element), such as a TFT element, is provided in a pixel and a wiring to which the TFT element and the like are connected is electrically connected to an external circuit (scanning line electrode circuit (source driver), data signal electrode circuit (gate driver), and power supply circuit) for driving the light source 4.

(Configuration of Display Device 50)

Figure 7:
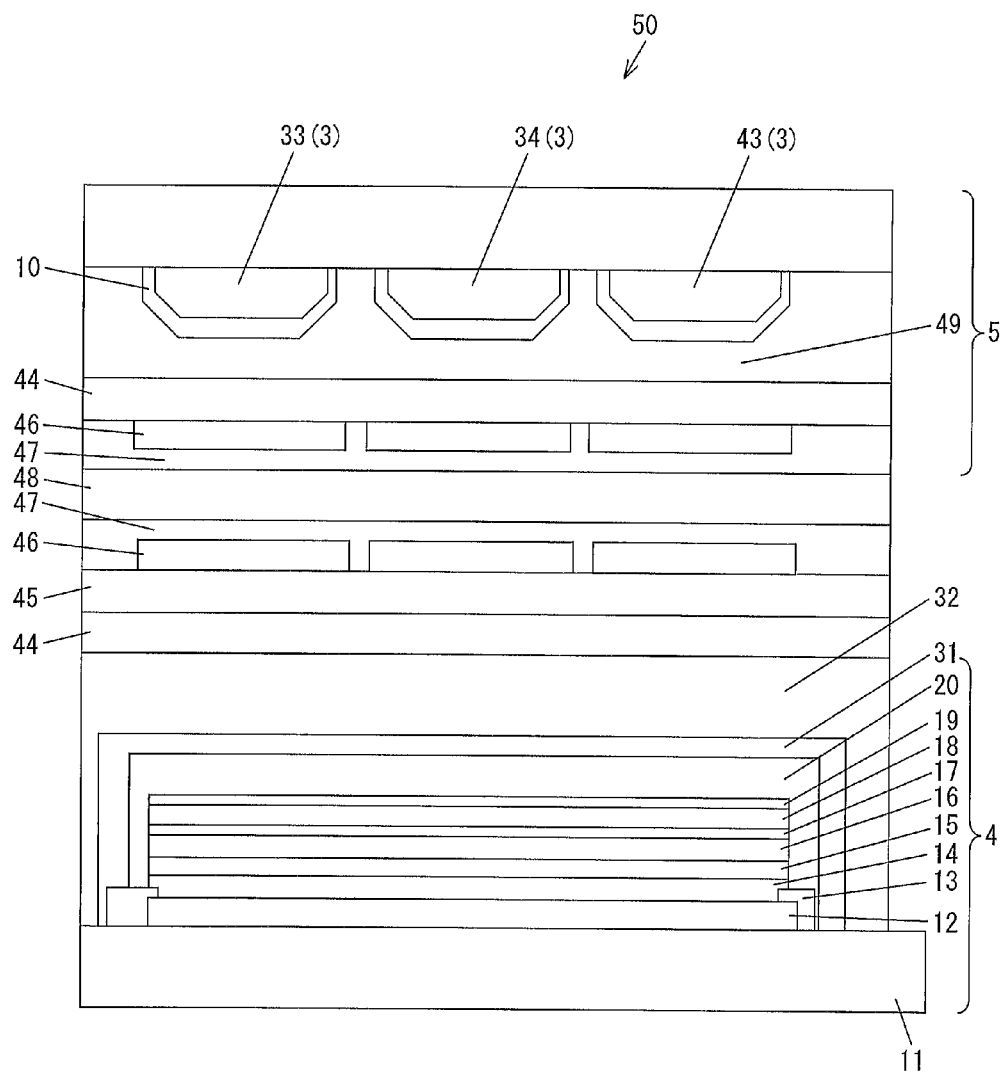
FIG. 7 is a cross sectional view schematically illustrating a configuration example of a display device in which an organic EL element, liquid crystal, and fluorescent materials are combined with each other.

The display device 50 described above is realized as a display device in which the organic EL element, the liquid crystal, and the fluorescent material are combined with each other (see FIG. 7). FIG. 7 is a cross sectional view schematically illustrating an example of an arrangement of the display device 50 in which the organic EL element, the liquid crystal, and the fluorescent material are combined with each other. The display device 5 illustrated in FIG. 7 is mainly constituted by the fluorescent substrate 5 illustrated in FIG. 1 and the light source 4 illustrated in FIG. 3. The display device 50 further includes a polarizing plate 44, a substrate 45, a transparent electrode 46, an alignment film 47, a liquid crystal layer 48, and a planarizing layer 49. Further, as the fluorescent layer 3, the display device 50 further includes a red light-emitting fluorescent layer 33, a green light-emitting fluorescent layer 34, and a blue light-emitting fluorescent layer 43.

(Polarizing Plates 44)

The display device 50 illustrated in FIG. 7 includes the polarizing plate 44 which is provided on the light-extraction side. As the polarizing plate 44, it is possible to use a combination of a conventional linear polarizing plate and a conventional λ/4 plate. By providing the polarizing plate 44, it is possible to prevent external light from being reflected from the electrode of the display device 50, a surface of the substrate of the display device 50, or a surface of the sealing substrate of the display device 50. This makes it possible to improve the display device 50 in contrast.

(Liquid Crystal Element)

A liquid crystal element is provided between the fluorescent layer 3 and the light source 4. The liquid crystal element is a known liquid crystal element. For example, the liquid crystal element is constituted by (i) a liquid crystal cell and a pair of polarizing plates 44 between which the liquid crystal cell is provided. However, the liquid crystal element is not limited to this example. The polarizing plate 44 can be provided as a layer. The liquid crystal cell is such that the liquid crystal layer 48 is supported between two electrode substrates 45. Further, one (1) optical anisotropic layer is provided between the liquid crystal cell and one of the pair of polarizing plates 44. Alternatively, two optical anisotropic layers are provided, respectively, (i) between the liquid crystal cell and one of the pair of polarizing plates 44, and (ii) between the liquid crystal cell and the other one of the pair of polarizing plates 44. The liquid crystal cell is not particularly limited in sort, and a sort of liquid crystal cell can be selected as appropriate in accordance with a purpose. Examples of the sort of liquid crystal cell encompass a TN mode, a VA mode, an OCB mode, an IPS mode, and an ECB mode.

The liquid crystal element has a function of an optical shutter for selectively transmitting light emitted from the light source 4. A method for driving the liquid crystal element can be a passive driving method or an active driving method in which a switching element such as a TFT is used. It is further preferable to employ a combination of the switching of the liquid crystal element and the switching of the light source 4. In this case, it is possible to have a further reduction in power consumption.

EXAMPLES

Examples of the present invention and a comparative example are specifically described below with reference to FIGS. 8 through 11 and 13 through 15. Note, however, that the present invention is not limited to these. For the sake of simple explanation, members having the functions identical to those of the members discussed in the aforementioned embodiment are given the signs identical with those of the members discussed in the aforementioned embodiment in each of the following examples and comparative example.

Comparative Example 1

The following description will discuss a process of manufacturing a fluorescent substrate in accordance with Comparative Example 1. In the present Comparative Example 1, a substrate for the fluorescent substrate was a glass substrate having a thickness of 0.7 mm. First, the glass substrate was washed with water. Then, the glass substrate was subjected to ultrasonic cleaning with the use of purified water for 10 minutes, and after that, was subjected to ultrasonic cleaning with the use of acetone for 10 minutes. Then, the glass substrate was subjected to vapor washing with the use of isopropyl alcohol for 5 minutes. After that, the glass substrate was dried for 1 hour at 100° C.

After the drying was carried out, a green fluorescent layer having a film thickness of 100 μm was formed on the glass substrate in the following manner. First, 15 g of ethanol and 0.22 g of γ-glycidoxypropyltrimethoxysilane were added to 0.16 g of aerosil whose average particle diameter was 5 nm, and a mixture thus obtained was stirred at room temperature in an open system for one hour. Then, the mixture and 20 g of a green fluorescent material ($Ca_{0.97}Mg_{0.03}$: $ZrO_3$: Ho) were moved to a mortar, and grinded and mixed with each other there sufficiently. Then, a mixture thus obtained was heated, in an oven, at 70° C. for two hours and then was further heated at 120° C. for two hours. Surface-modified $Ba_2SiO_4$:$Eu^{2+}$ was thus obtained.

Next, 30 g of polyvinyl alcohol, which was dissolved in 300 g of a mixed solution of water and dimethylsulfoxide (1 : 1), was added to 10 g of surface-modified $Ca_{0.97}Mg_{0.03}$: $ZrO_3$: Ho. Then, a mixture thus obtained was stirred by use of a disperser. A coating solution for forming a green fluorescent layer was thus obtained. Then, the coating solution for forming the green fluorescent layer was applied, by a screen printing method, to a desired region (width: 3 mm) of the glass substrate. Then, the glass substrate was heated by use of a vacuum oven (200° C., 10 mmHg) for 4 hours, and, as a result, was dried. A green fluorescent layer was thus formed. As a result, a fluorescent substrate was completed.

A luminance conversion efficiency of the fluorescent substrate thus obtained was measured at a temperature of 25° C. The measuring was carried out with the use of a commercially-available luminance meter (BM-7: manufactured by TOPCON TECHNOHOUSE CORPORATION) under such a condition that a blue LED was used to emit excitation light having a peak wavelength of 450 nm. As illustrated in FIG. 15, a luminance of the light emitted from the blue LED, serving as the excitation light, was 1,000 cd/m². Meanwhile, light transmitted through and emitted from the fluorescent layer was green light having a peak wavelength of 547 nm and had a luminance of 1,023 cd/m², and a luminance conversion efficiency was 1.0%. Here, FIG. 15 is a table illustrating results of each comparative example and each example.

Example 1

The following description will discuss a process of manufacturing a fluorescent substrate in accordance with Example 1. First, a green fluorescent layer having a film thickness of 100 μm was formed on a substrate by use of a commercially-available dispenser. The green fluorescent layer thus obtained had a trapezoid shape as illustrated in (c) of FIG. 2. Then, a reflecting layer having a film thickness of 20 nm was formed on the green fluorescent layer. The reflecting layer was formed in such a manner that the substrate was rotated, while gold was provided by use of a sputtering method. According to the present example, by use of the green fluorescent layer having the shape described above and the aforementioned film forming method, the reflecting layer was uniformly formed on a back surface of the green fluorescent layer (a surface on which excitation light was to be incident) and a side surface of the green fluorescent layer. Other than these, a fluorescent substrate of Example 1 was manufactured in the same manner as Comparative Example 1 described above.

Figure 8:
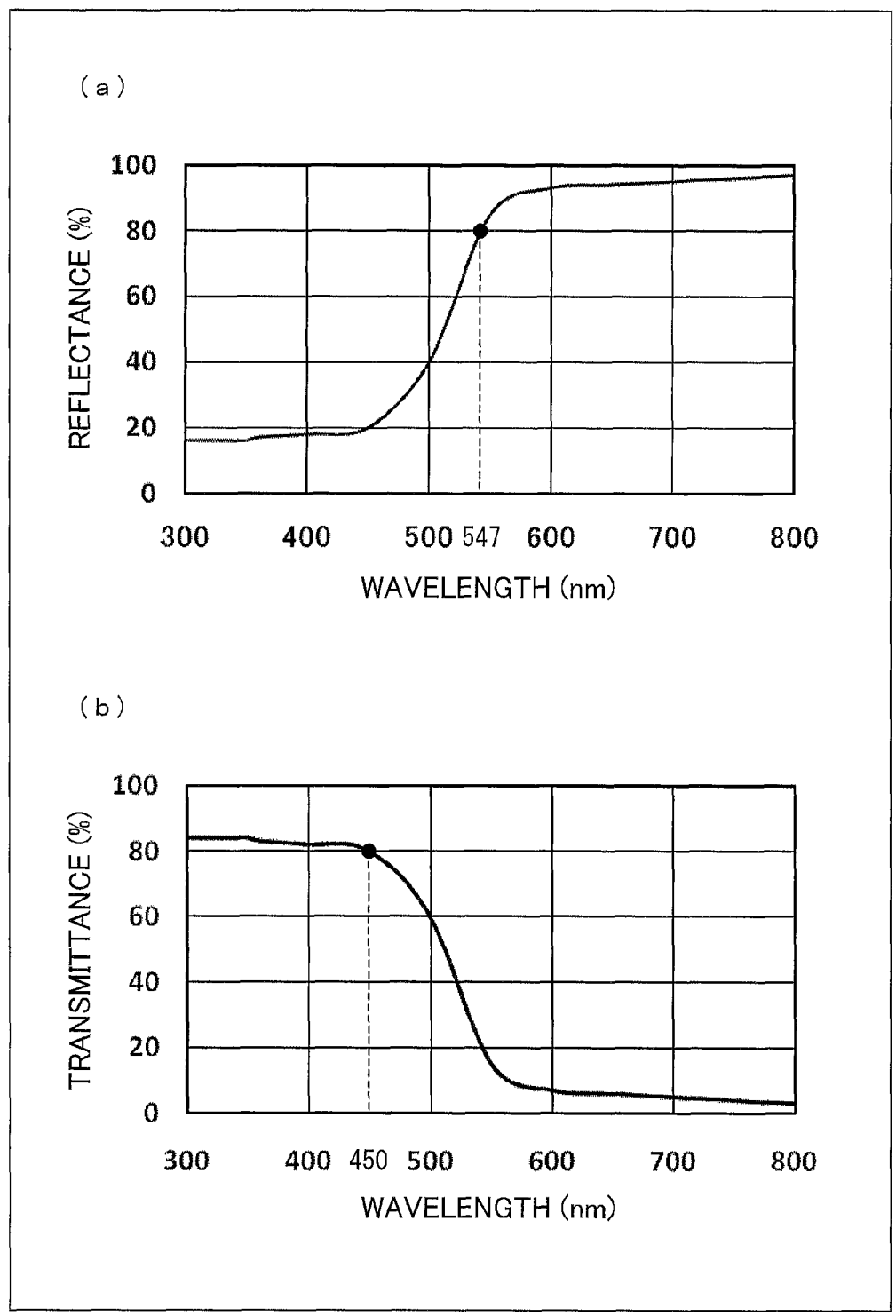
FIG. 8 is a view illustrating a reflectance spectrum and a transmission spectrum of a reflecting layer in accordance with Example 1: (a) of FIG. 8 illustrates the reflectance spectrum of the reflecting layer in accordance with Example 1; and (b) of FIG. 8 illustrates the transmission spectrum of the reflecting layer in accordance with Example 1.

Spectral characteristics of the fluorescent substrate of Example 1 were measured by use of a commercially-available spectral photometer (U-2900: manufactured by Hitachi High-Technologies Corporation). FIG. 8 is a view illustrating a reflectance spectrum and a transmission spectrum of the reflecting layer in accordance with Example 1. A transmittance of the reflecting layer at a peak wavelength (450 nm) of the excitation light (blue light) was 80%. Further, a reflectance of the reflecting layer at a peak wavelength (547 nm) of light emitted from the fluorescent layer was 80% (see FIGS. 8 and 15).

Moreover, a luminance conversion efficiency of the fluorescent substrate was measured at 25° C. under such a condition that a blue LED was used to emit the excitation light (450 nm) in the same manner as Comparative Example 1. As shown in FIG. 15, a luminance of the excitation light was 1,000 cd/m$^2$. Meanwhile, the light transmitted through and emitted from the green fluorescent layer was green light having a peak wavelength of 547 nm and had a luminance of 3,880 cd/m$^2$ and a luminance conversion efficiency of 380%. That is, the luminance of the light obtained in Example 1 was increased to be 3.8 times larger than that of light obtained in Comparative Example 1.

Example 2

The following description will discuss a process of manufacturing a fluorescent substrate in accordance with Example 2. First, a light-absorbing layer, made from chrome, was formed on a substrate so as to have a trapezoid shape. The light-absorbing layer had a width of 20 μm, and a film thickness of 500 nm, and a pitch between adjacent ones of light-absorbing layers was 200 μm. Then, a green fluorescent layer was formed between the adjacent ones of light-absorbing layers by use of a commercially-available dispenser. The green fluorescent layer had a film thickness of 100 μm and a shape illustrated in (e) of FIG. 2. Other than these, a fluorescent substrate of Example 2 was manufactured in the same manner as Example 1.

Spectral characteristics of the fluorescent substrate of Example 2 were measured in the same manner as Example 1. A transmittance of the reflecting layer at a peak wavelength (450 nm) of excitation light (blue light) was 80%, and a reflectance of the reflecting layer at a peak wavelength (547 nm) of light emitted from the fluorescent layer was 80% (see FIG. 15).

Then, a luminous conversion efficiency of the fluorescent substrate was measured at 25° C. under such a condition that a blue LED was used to emit excitation light (450 nm), in the same manner as Comparative Example 1. A luminance of the excitation light was 1,000 cd/m$^2$. Meanwhile, light transmitted through and emitted from the green fluorescent layer was green light having a peak wavelength of 547 nm and had a luminance of 3,902 cd/m$^2$, and a luminous conversion efficiency of 380% (see FIG. 15). That is, a luminance of the light obtained in Example 2 was increased to be 3.8 times larger than that of light obtained in Comparative Example 1.

Example 3

In Example 3, gold having a film thickness of 40 nm was used as a reflecting layer. Other than this, a fluorescent substrate was manufactured in the same manner as Example 2.

Spectral properties of the fluorescent substrate thus obtained were measured in the same manner as Example 1. A transmittance of the reflecting layer at a peak wavelength (450 nm) of excitation light (blue light) was 30%. Further, a reflectance of the reflecting layer at a peak wavelength (547 nm) of light emitted from a fluorescent layer was 90% (see FIG. 15).

Then, a luminance conversion efficiency of the fluorescent substrate was measured at 25° C. under such a condition that a blue LED was used to emit the excitation light (450 nm), in the same manner as Example 1. A luminance of the excitation light was 1,000 cd/m$^2$. Meanwhile, light transmitted through and emitted from a green fluorescent layer was green light having a peak wavelength of 547 nm and had a luminance of 1,605 cd/m$^2$, and a luminance conversion efficiency of 160% (see FIG. 15). That is, a luminance of the light obtained in Example 3 was increased to be 1.6 times larger than that of light obtained in Comparative Example 1.

Example 4

In Example 4, gold having a film thickness of 30 nm was used as a reflecting layer. Other than this, a fluorescent substrate of Example 4 was manufactured in the same manner as Example 2.

Spectral characteristics of the fluorescent substrate of Example 4 were measured in the same manner as Example 1. As shown in FIG. 15, a transmittance of the reflecting layer at a peak wavelength (450 nm) of excitation light (blue light) was 60%. Further, a reflectance of the reflecting layer at a peak wavelength (547 nm) of light emitted from a fluorescent layer was 85%.

Moreover, a luminance conversion efficiency of the fluorescent substrate thus obtained was measured at 25° C. under such a condition that a blue LED was used to emit the excitation light (450 nm), in the same manner as Comparative Example 1. A luminance of the excitation light was 1,000 cd/m$^2$. Meanwhile, light transmitted through and emitted from a green fluorescent layer was green light having a peak wavelength of 547 nm and had a luminance of 3,060 cd/m$^2$, and a luminance conversion efficiency of 300% (see FIG. 15). That is, a luminance of the light obtained in Example 4 was increased to be 3.0 times larger than that of light obtained in Comparative Example 1.

Example 5

In Example 5, gold having a film thickness of 10 nm was used as a reflecting layer. Other than this, a fluorescent substrate was manufactured in the same manner as Example 2.

Further, spectral characteristics of the fluorescent substrate thus manufactured were measured in the same manner as Example 1. A transmittance of the reflecting layer at a peak wavelength (450 nm) of excitation light (blue light) was 85%. Furthermore, a reflectance of the reflecting layer at a peak wavelength (547 nm) of light emitted from a fluorescent layer was 50% (see FIG. 15).

Moreover, a luminance conversion efficiency of the fluorescent substrate was measured at 25° C. under such a condition that a blue LED was used to emit the excitation light (450 nm) in the same manner as Comparative Example 1. A luminance of the excitation light was 1,000 $cd/m^2$. Meanwhile, light transmitted thorough and emitted from a green fluorescent layer was green light having a peak wavelength of 547 nm and had a luminance of 2,848 $cd/m^2$, and a luminance conversion efficiency of 280% (see FIG. 15). That is, a luminance of the light obtained in Example 5 was increased to be 2.8 times larger than that of light obtained in Comparative Example 1.

Example 6

In Example 6, gold having a film thickness of 5 nm was used as a reflecting layer. Other than this, a fluorescent substrate of Example 6 was manufactured in the same manner as Example 2.

Spectral characteristics of the fluorescent substrate of Example 6 were measured in the same manner as Example 1. A transmittance of the reflecting layer at a peak wavelength (450 nm) of excitation light (blue light) was 90% (see FIG. 15). A reflectance of the reflecting layer at a peak wavelength (547 nm) of light emitted from a fluorescent layer was 4%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 945 $cd/m^2$, and a luminance conversion efficiency of 92% (see FIG. 15). That is, a luminance of the light obtained in Example 6 was decreased to be 0.9 time larger than that of light obtained in Comparative Example 1.

Example 7

In Example 7, a dielectric multilayer film was used as a reflecting layer. Specifically, the reflecting layer was made of 6 layers. The reflecting layer was formed in such a manner that a titanium oxide film ($TiO_2$: refractive index=2.30) and a silicon oxide film ($SiO_2$: refractive index=1.47) were formed, alternately, by an EB vapor-deposition method. Other than this, a fluorescent substrate was manufactured in the same manner as Example 2.

Figure 9:
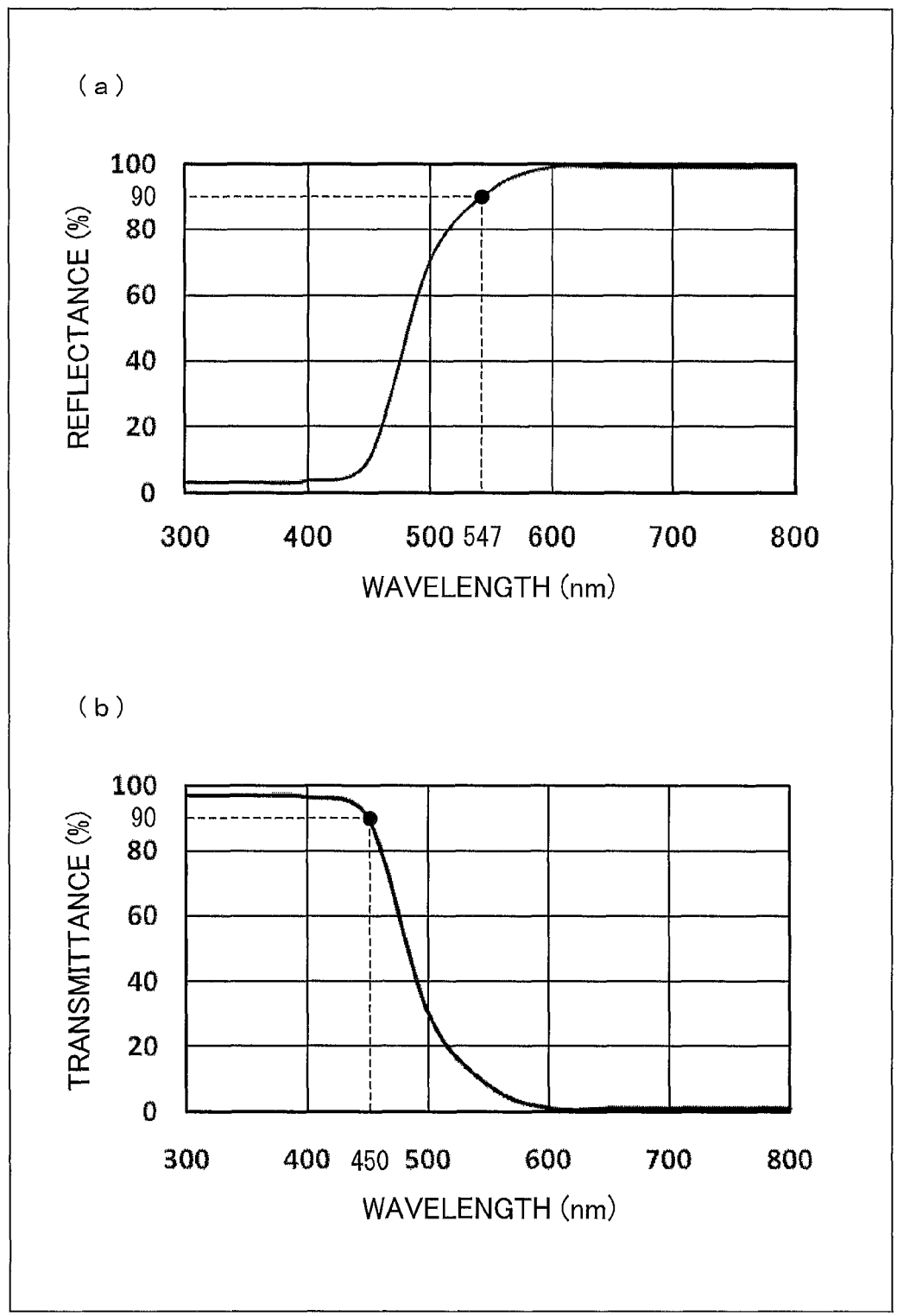
FIG. 9 is a view illustrating a reflectance spectrum and a transmission spectrum of a reflecting layer in accordance with Example 7: (a) of FIG. 9 illustrates the reflectance spectrum of the reflecting layer in accordance with Example 7; and (b) of FIG. 9 illustrates the transmission spectrum of the reflecting layer in accordance with Example 7.

Spectral characteristics of the fluorescent substrate of Example 7 were measured in the same manner as Example 1. FIG. 9 is a view illustrating a reflectance spectrum and a transmission spectrum of the reflecting layer in accordance with Example 7. A transmittance of the reflecting layer at a peak wavelength (450 nm) of excitation light (blue light) was 90% (see FIGS. 9 and 15). A reflectance of the reflecting layer at a peak wavelength (547 nm) of light emitted from a fluorescent layer was 90%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of at 4,815 $cd/m^2$, and a luminance conversion efficiency of 470% (see FIG. 15). That is, a luminance of the light obtained in Example 7 was increased to be 4.7 times larger than that of light obtained in Comparative Example 1.

Example 8

In Example 8, gold having a film thickness of 50 nm was used as a reflecting layer. Other than this, a fluorescent substrate of Example 8 was manufactured in the same manner as Example 2.

Spectral characteristics of the fluorescent substrate of Example 8 were measured in the same manner as Example 2. A transmittance of the reflecting layer at a peak wavelength (450 nm) of excitation light (blue light) was 5% (see FIG. 15). A reflectance of the reflecting layer at a peak wavelength (547 nm) of light emitted from a fluorescent layer was 92%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 273 $cd/m^2$, and a luminance conversion efficiency 27% (see FIG. 15). That is, a luminance of the light obtained in Example 8 was decreased to be 0.3 time larger than that of light obtained in Comparative Example 1.

Example 9

In Example 9, a fluorescent layer was formed so as to have a shape illustrated in (a) of FIG. 2. Other than this, a fluorescent substrate was manufactured in the same manner as Example 1.

Spectral characteristics of the fluorescent substrate of Example 9 were measured in the same manner as Example 1. As shown in FIG. 15, a transmittance of a reflecting layer at a peak wavelength (450 nm) of excitation light (blue light) was 80%. Further, a reflectance of the reflecting layer at a peak wavelength (547 nm) of light emitted from the fluorescent layer was 80%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 3,898 $cd/m^2$, and a luminance conversion efficiency of 380% (see FIG. 15). That is, a luminance of the light obtained in Example 9 was increased to be 3.8 times larger than that of light obtained in Comparative Example 1.

Example 10

In Example 10, a fluorescent layer was formed so as to have a shape illustrated in (b) of FIG. 2. Other than this, a fluorescent substrate of Example 10 was manufactured in the same manner as Example 1.

Spectral properties of the fluorescent substrate of Example 10 were measured in the same manner as Example 1. As shown in FIG. 15, a transmittance of a reflecting layer at a peak wavelength (450 nm) of excitation light (blue light) was 80%. Further, a reflectance of the reflecting layer at a peak wavelength (547 nm) of light emitted from the fluorescent layer was 80%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 3,823 $cd/m^2$, and a luminance conversion efficiency of 370% (see FIG. 15). That is, a luminance of the light obtained in Example 10 was increased to be 3.7 times larger than that of light obtained in Comparative Example 1.

Example 11

In Example 11, a fluorescent layer was formed so as to have a shape illustrated in (d) of FIG. 2. Other than this, a fluorescent substrate of Example 11 was manufactured in the same manner as Example 2.

Spectral characteristics of the fluorescent substrate of Example 11 were measured in the same manner as Example 2. As shown in FIG. 15, a transmittance of a reflecting layer at a peak wavelength (450 nm) of excitation light (blue light) was 80%. Further, a reflectance of the reflecting layer at a peak wavelength (547 nm) of light emitted from the fluorescent layer was 80%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 3,912 $cd/m^2$, and a luminance conversion efficiency of 380% (see FIG. 15). That is, a luminance of the light obtained in Example 11 was increased to be 3.8 times larger than that in Comparative Example 1.

Example 12

In Example 12, a fluorescent layer was formed so as to have a shape illustrated in (f) of FIG. 2. Other than this, a fluorescent substrate of Example 12 was manufactured in the same manner as Example 2.

Spectral characteristics of the fluorescent substrate of Example 12 were measured in the same manner as Example 2. As shown in FIG. 15, a transmittance of a reflecting layer at a peak wavelength (450 nm) of excitation light (blue light) was 80%. Further, a reflectance of the reflecting layer at a peak wavelength (547 nm) of light emitted from the fluorescent layer was 80%.

Moreover, a luminance conversion efficiency of the fluorescent substrate was measured at 25° C. under such a condition that a blue LED was used to emit the excitation light (450 nm), in the same manner as Comparative Example 1. A luminance of the excitation light was 1,000 $cd/m^2$. Meanwhile, light transmitted through and emitted from a green fluorescent layer was green light having a peak wavelength of 547 nm and had a luminance of 3,879 $cd/m^2$, and a luminance conversion efficiency of 380% (see FIG. 15). That is, a luminance of the light obtained in Example 12 was increased to be 3.8 times larger than that of light obtained in Comparative Example 1.

Example 13

In Example 13, a fluorescent layer was formed so as to have a shape illustrated in (f) of FIG. 2. Other than this, a fluorescent substrate of Example 13 was manufactured in the same manner as Example 2.

Spectral characteristics of the fluorescent substrate of Example 13 were measured in the same manner as Example 2. As shown in FIG. 15, a transmittance of a reflecting layer at a peak wavelength (450 nm) of excitation light (blue light) was 80%. Further, a reflectance of the reflecting layer at a peak wavelength (547 nm) of light emitted from the fluorescent layer was 80%.

Next, a blue light-emitting organic EL element was manufactured as a light source for emitting excitation light. First, an anode was formed on a glass substrate having a thickness of 0.7 mm. The anode was formed in the following manner. Silver is provided by a sputtering method so as to have a film thickness of 100 nm. On the film made from silver, an indium-tin oxide (ITO) was provided by the sputtering method. A film made from the indium-tin oxide had a film thickness of 20 nm. Further, the film made from the indium-tin oxide was patterned by a conventional photolithography method, so as to have a stripe shape having a width of 2 mm. The anode was thus formed.

Then, $SiO_2$ was provided on the anode by the sputtering method so as to have a film thickness of 200 nm. Further, a film of $SiO_2$ thus obtained was patterned so as to cover only an edge part of the anode. The patterning was carried out by a conventional photolithography method. An edge cover was thus formed. The edge cover covered only parts of the anode, which parts extended from ends on both short sides by 10 μm. Then, a resultant substrate was washed with water (10 minutes), and then was subjected to ultrasonic cleaning with the use of purified water (10 minutes), and after that was subjected to ultrasonic cleaning with the use of acetone (10 minutes). Then, the substrate was subjected to vapor washing with the use of isopropyl alcohol (5 minutes). After that, the resultant substrate was dried at 120° C. for 1 hour.

Next, the substrate was fixed to a substrate holder provided in an electric resistance heating vapor-deposition device, and an atmosphere pressure was reduced to $1 \times 10^{-4}$ Pa or smaller (i.e., to a vacuum condition). Each organic layer was thus formed. Specifically, first, a hole injection layer 14 having a film thickness of 100 nm was formed by a resistance heating vapor-deposition method by using 1,1-bis-di-4-tolylamino-phenyl-cyclohexane (TAPC) as a hole injection material.

Next, a hole transport layer having a film thickness of 40 nm was formed by a resistance heating vapor-deposition method by using N,N'-di-1-naphthyl-N,N-diphenyl-1,1'-biphenyl-1,1'-biphenyl-4,4'-diamine (NPD) as a hole transport material.

Then, a blue organic light-emitting layer (thickness: 30 nm), which served as a light-emitting layer, was formed on the hole transport layer. The blue organic light-emitting layer was formed by causing 1,4-bis-triphenylsilyl-benzene (UGH-2) (host material) and bis[2-(4',6'-difluorophenyl) pyridinato-N,C2'] tetrakis (1-pyrazolyl) borate (Fir6) (blue phosphorescent dopant) to be subjected to co-evaporation. The formation of the blue organic light-emitting layer was carried out under such a condition that a deposition rate of 1,4-bis-triphenylsilyl-benzene (UGH-2) (host material) was 1.5 Å/sec, and a deposition rate of bis[2-(4',6'-difluorophenyl) pyridinato-N, C2'] tetrakis (1-pyrazolyl) borate (Fir6) (blue phosphorescent dopant) was 0.2 Å/sec.

Then, a hole-blocking layer 17 (thickness: 10 nm) was formed on the light-emitting layer 16 with the use of 2,9-dimethyl-4,7-diphenyl-1,10-phenanthroline (BCP).

Next, an electron transport layer (thickness: 30 nm) was formed on the hole blocking layer 17 with the use of tris (8-hydroxyquinoline) aluminum ($Alq_3$).

Then, an electron injection layer (thickness: 0.5 nm) was formed on the electron transport layer with the use of lithium fluoride (LiF).

After that, a cathode was formed in the following manner. First, the substrate was fixed to a metal vapor-deposition chamber. Then, the substrate and a shadow mask for forming the cathode were aligned with respect to each other. The shadow mask for forming the cathode had an opening for forming a stripe shape (width: 2 mm) of the cathode. A position of the opening faced a position of a stripe of the anode. Via the shadow mask, magnesium and silver were provided on the electron injection layer by a vacuum deposition (co-evaporation) method so as to have a desired pattern (thickness: 1 nm). A deposition rate of magnesium was 0.1 Å/sec and a deposition rate of silver was 0.9 Å/sec.

Further, on the cathode thus formed, silver was provided on at a deposition rate of 1 Å/sec so as to have a desired pattern (thickness: 19 nm).

Next, an inorganic sealing film (thickness: 3 μm) made from $SiO_2$ was formed. The inorganic sealing film was formed by patterning by a plasma CVD method by use of the shadow mask so that $SiO_2$ was provided in a sealing area which had a width of 2 mm, and extended around a display region.

With the process described above, manufacturing of a light source made of an organic EL element was completed.

Further, a luminance conversion efficiency of the fluorescent substrate was measured at 25° C. under such a condition that a blue EL element was used to emit excitation light (450 nm). A luminance of the excitation light was 1,000 cd/m². Meanwhile, light transmitted through and emitted from a green fluorescent layer was green light having a peak wavelength of 547 nm and had a luminance of 3,901 cd/m², and a luminance conversion efficiency of 380% (see FIG. 15). That is, a luminance of the light obtained in Example 13 was increased to be 3.8 times larger than that of light obtained in Comparative Example 1.

Example 14

Figure 13:
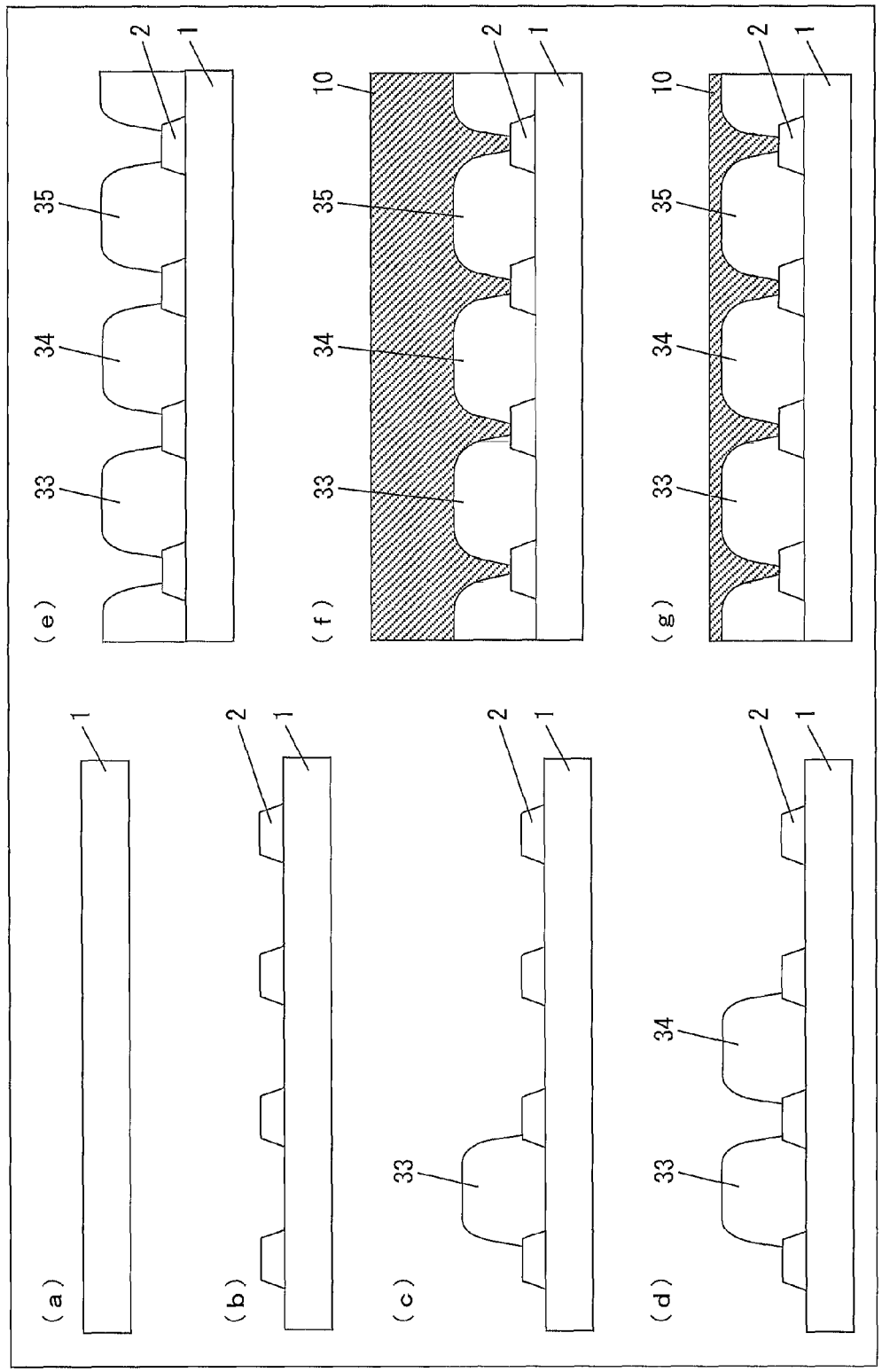
FIG. 13 is a view illustrating a process of manufacturing a fluorescent substrate in accordance with Example 14: (a) through (g) of FIG. 13 illustrate respective steps in the process of manufacturing the fluorescent substrate in accordance with Example 14.

The following description will discuss Example 14 with reference to FIG. 13. FIG. 13 is a view illustrating a process of manufacturing a fluorescent substrate in accordance with an example of the present invention. In Example 14, a fluorescent layer was formed so as to have a shape illustrated in (f) of FIG. 2 (see (a) through (e) of FIG. 13). Next, gold was provided by a sputtering method so as to have a film thickness of 200 μm (see (f) of FIG. 13). After that, a resultant substrate was treated for 1 hour in an aqua regalis (nitric acid:hydrochloric acid=1: 3) whose temperature was 250° C., so that moisture in the reflecting layer was completely dried (see (g) of FIG. 13). Other than this, a fluorescent substrate of Example 13 was manufactured in the same manner as Example 2.

Note, here, that, by using a wet process, it was possible to obtain a planar surface in a wet condition, irrespective of concavities and convexities formed on the substrate. On this condition, spectral characteristics of the fluorescent substrate of Example 14 were measured in the same manner as Example 2. As shown in FIG. 15, a transmittance of the reflecting layer at a peak wavelength (450 nm) of excitation light (blue light) was 80%. A reflectance of the reflecting layer at a peak wavelength (547 nm) of light emitted from the fluorescent layer was 85%.

Moreover, a luminance conversion efficiency of the fluorescent substrate was measured at 25° C. under such a condition that a blue EL element was used to emit the excitation light (450 nm), in the same manner as Example 13. A luminance of the excitation light was 1,000 cd/m². Meanwhile, light transmitted through and emitted from a green fluorescent layer was green light having a peak wavelength of 547 nm and had a luminance of 4,829 cd/m², and a luminance conversion efficiency of 470% (see FIG. 15). That is, a luminance of the light obtained in Example 14 was increased to be 4.8 times larger than that of light obtained in Comparative Example 1.

(List of Results)

FIG. 15 is a table illustrating results of Comparative Example 1 and Examples 1 through 14. As is clear from the table illustrated in FIG. 15, in a case where a condition of one of Examples 1, 2, 7, and 9 through 14 is satisfied, it is possible to manufacture a fluorescent substrate whose performance is better than that of a fluorescent substrate of Comparative Example 1.

Example 15

The following description will discuss a process of manufacturing a display device in accordance with Example 15. The display device of the present example includes at least a light source (blue organic EL element) and a fluorescent substrate.

Figure 14:
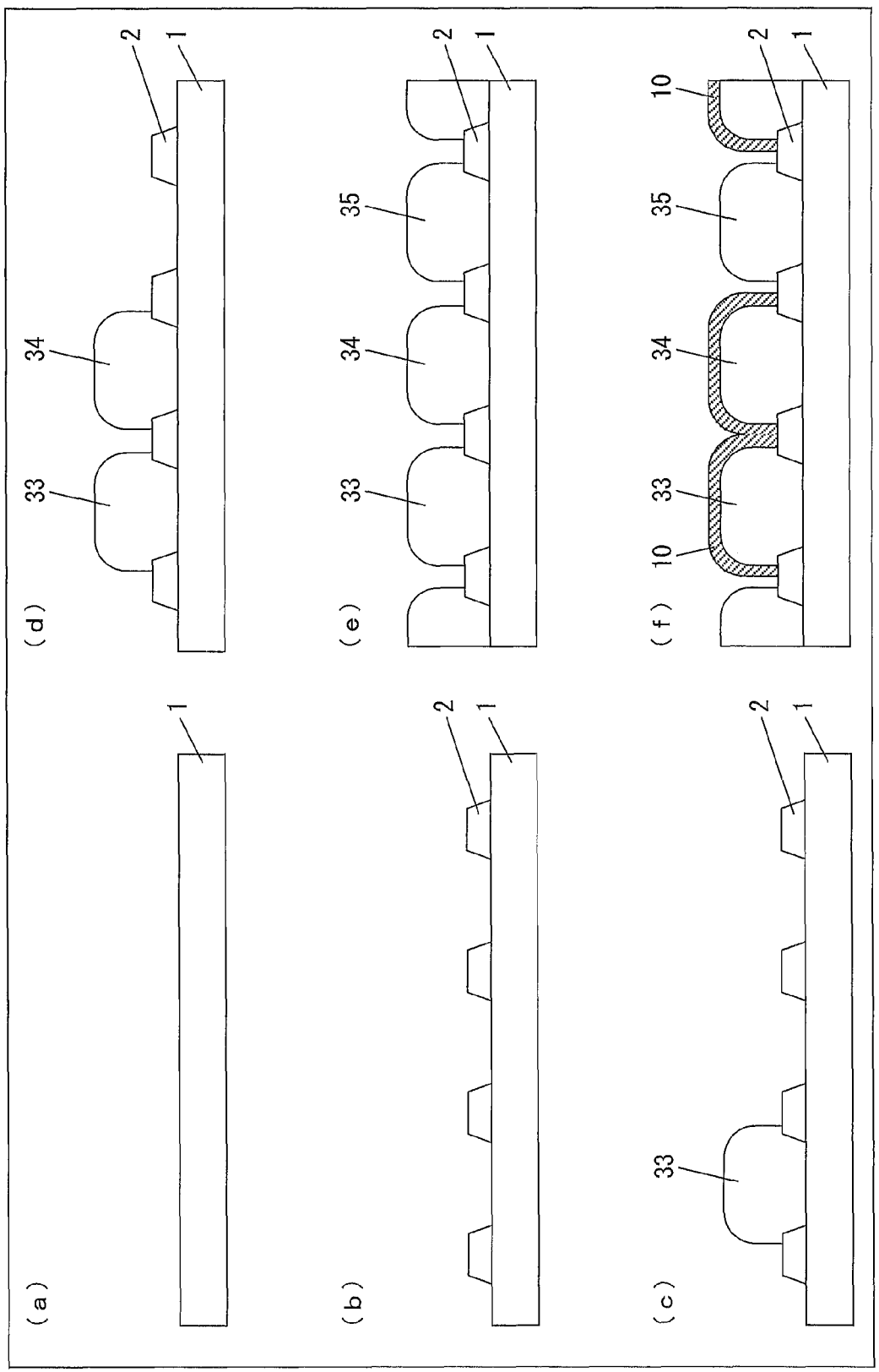
FIG. 14 is a view illustrating a process of manufacturing a fluorescent substrate in accordance with Example 15: (a) through (f) of FIG. 14 illustrates respective steps in the process of manufacturing the fluorescent substrate in accordance with Example 15.

A glass substrate, which had a thickness of 0.7 mm, was used as a substrate for a fluorescent substrate (see (a) of FIG. 14). Then, a red fluorescent layer, a green fluorescent layer, and a blue light-scattering layer were formed on the glass substrate. A fluorescent substrate was thus obtained. First, a light-absorbing layer was formed on the fluorescent substrate. In this case, the light-absorbing layer was made from chrome, and was formed so as to have a trapezoid shape having a width of 20 μm and a film thickness of 500 nm. A pitch between adjacent ones of light-absorbing layers was 200 μm (see (b) of FIG. 14).

(Formation of Red Fluorescent Layer)

Then, the red fluorescent layer was formed. First, 15 g of ethanol and 0.22 g of γ-glycidoxypropyltrimethoxysilane were added to 0.16 g of aerosil whose average particle diameter was 5 nm. Then, a mixture thus obtained was stirred in an open system at room temperature for 1 hour. The mixture thus obtained and 20 g of a red fluorescent material $K_5Eu_{2.5}(WO_4)_{6.25}$ were moved to a mortar, and then sufficiently grinded and mixed, and after that, heated in an oven at 70° C. for two hours. Then, a mixture thus obtained was heated at 120° C. for two hours. As a result, surface-modified $K_5Eu_{2.5}(WO_4)_{6.25}$ was obtained.

Next, 30 g of polyvinyl alcohol, which was dissolved in 300 g of a mixed solution of water and dimethylsulfoxide (1:1), was added to 10 g of surface-modified $K_5Eu_{2.5}(WO_4)_{6.25}$. Then, a mixture thus obtained was stirred by a disperser. A coating solution for forming the red fluorescent layer was thus produced. Then, the coating solution thus produced was applied, by a screen printing method, to a region of the glass substrate, in which region no light-absorbing layer was formed. Then, the coating solution thus applied was dried by being heated in a vacuum oven for 4 hours (200° C., 10 mmHg). Formation of the red fluorescent layer having a film thickness of 50 μm was thus completed (see (c) of FIG. 14).

(Formation of Green Fluorescent Layer)

Next, the green fluorescent layer was formed. First, 15 g of ethanol and 0.22 g of γ-glycidoxypropyltriethoxysilane were added to 0.16 g of aerosil having an average particle diameter of 5 nm. Then, a mixture thus obtained was stirred in an open system at room temperature for one hour. Then, the mixture and 20 g of a green fluorescent material $Ba_2SiO_4:Eu^{2+}$ were moved to a mortar, and then was sufficiently grinded and mixed, and after that was heated in an oven at 70° C. for two hours. Then, a mixture thus obtained was heated in an oven at 120° C. for two hours. As a result, surface-modified $Ba_2SiO_4:Eu^{2+}$ was obtained.

Then, 30 g of polyvinyl alcohol, which was dissolved in 300 g of a mixed solution of water and dimethylsulfoxide (1:1), was added to 10 g of surface-modified $Ba_2SiO_4:Eu^{2+}$. Then, a mixture thus obtained was stirred by a disperser. A coating solution for forming the green fluorescent layer was thus produced. Then, the coating solution thus produced was applied, by a screen printing method, to a region of the glass substrate, in which region no light-absorbing layer was formed. Then, the coating solution thus applied was dried by being heated in a vacuum oven (200° C., 10 mmHg) for 4 hours. Formation of the green fluorescent layer having a film thickness of 50 μm was thus completed (see (d) of FIG. 14).

(Formation of Blue Light-Scattering Layer)

Next, the blue light-scattering layer was formed. First, 30 g of polyvinyl alcohol, which was dissolved in 300 g of a mixed solution of water and dimethylsulfoxide (1:1), was added to 20 g of silica particles (refractive index: 1.65) having a particle diameter of 1.5 μm. Then, a mixture thus obtained was stirred by a disperser. A coating solution for forming a blue light-scattering layer was thus produced. Then, the coating solution thus produced was applied to a region of the glass substrate by a screen printing method, in which region no light-absorbing layer was formed. After that, the coating solution thus applied was dried by being heated in a vacuum oven (200° C., 10 mmHg) for 4 hours. Formation of the blue light-scattering layer was thus completed (see (e) of FIG. 14).

(Formation of Reflecting Film)

Next, a reflecting layer having a film thickness of 20 nm was formed on each of the fluorescent layers. The reflecting layer was formed in such a manner that gold was provided by a sputtering method, while a substrate was rotated. The manufacturing of the fluorescent substrate was thus completed (see (f) of FIG. 14).

(Manufacturing of Blue Organic EL Element)

The following description will discuss a process of manufacturing a blue organic EL element which is used as a light source. A glass substrate having a thickness of 0.7 mm was used as a substrate 1 for the blue organic EL element. Then, an anode was formed on the glass substrate. The anode was formed in such a manner that silver (film thickness: 100 nm) was provided by a sputtering method. After that, an indium-tin oxide (ITO) was provided on silver by a sputtering method. A film thickness of the indium-tin oxide was 20 nm. Formation of the anode was thus completed. Then, patterning was carried out to the anode so that a pattern having 90 stripes (width: 160 μm, pitch: 200 μm) was formed. The patterning was carried out by a conventional photolithography method.

Next, $SiO_2$ was provided on the anode by the sputtering method so as to have a film thickness of 200 nm. Further, $SiO_2$ was patterned so as to cover only an edge section of the anode. The patterning was carried out by use of a conventional photolithography method. An edge cover was thus formed. The edge cover covered parts of the anode, which parts extend from respective ends on both short sides by 10 μm. After that, the substrate was washed water, and then was subjected to ultrasonic cleaning with the use of purified water (10 minutes), after that, was subjected to ultrasonic cleaning with the use of acetone (10 minutes). Then, the substrate was subjected to vapor cleaning with the use of isopropyl alcohol (5 minutes). After that, the substrate was dried at 120° C. for 1 hour.

(Formation of Each Organic Layer)

Then, the substrate was fixed to a substrate holder in a resistance heating vapor-deposition device, and air pressure was decreased to $1\times10^{-4}$ Pa or lower (i.e., to a vacuum condition). Each organic layer was thus formed. Specifically, first, a hole injection layer 14 having a film thickness of 100 nm was formed by a resistance heating vapor-deposition method by using 1,1-bis-di-4-tolylamino-phenyl-cyclohexane (TAPC) as a hole injection material.

Then, a hole transport layer having a film thickness of 40 nm was formed by a resistance heating vapor-deposition method by using N,N'-di-1-naphthyl-N,N'-diphenyl-1,1'-biphenyl-1,1'-biphenyl-4,4'-diamine (NPD) as a hole transport material.

Next, a blue organic light-emitting layer (thickness: 30 nm), which served as the light-emitting layer, was formed on the hole transport layer. The blue organic light-emitting layer was produced by causing 1,4-bis-triphenylsilyl-benzene (UGH-2) (host material) and bis[(4,6-difluorophenyl)-pyridinato-N,C2']picolinate iridium (Flrpic) (blue phosphorescent dopant) to be subjected to co-evaporation. The blue organic light-emitting layer was formed in such a manner that a deposition rate of 1,4-bis-triphenylsilyl-benzene (UGH-2) was 1.5 Å/sec and a deposition rate of bis [(4,6-difluorophenyl)-pyridinato-N,C2']picolinate iridium (Flrpic) was 0.2 Å/sec.

Then, a hole blocking layer 17 (thickness: 10 nm) was formed on the light-emitting layer 16 with the use of 2,9-dimethyl-4,7-diphenyl-1,10-phenanthroline (BCP).

After that, an electron transport layer (thickness: 30 nm) was formed on the hole blocking layer 17 with the use of tris (8-hydroxyquinoline) aluminum (Alq3).

Next, an electron injection layer (thickness: 0.5 nm) was formed on the electron transport layer with the use of lithium fluoride (LiF).

After that, a cathode was formed. First, the substrate was fixed to a metal vapor-deposition chamber. Then, the substrate and a shadow mask for forming the cathode were aligned with respect to each other. Here, the shadow mask had an opening for forming a cathode having a stripe shape (width: 500 μm, pitch: 600 μm). A position of the opening and a position of a stripe shape of the anode faced each other. Via the shadow mask, magnesium and silver were provided on the electron injection layer by a vacuum deposition (co-evaporation) method so as to have a desired pattern (thickness: 1 nm). A deposition rate of magnesium was 0.1 Å/sec and a deposition rate of silver was 0.9 Å/sec.

Then, silver was provided on the magnesium and silver at a deposition rate of 1 Å/sec so as to have a desired pattern (thickness: 19 nm). A purpose of providing silver was to enhance an interference effect and to prevent a reduction in voltage due to a resistance of a wiring of the cathode. Formation of the cathode was thus completed.

According to the organic EL element of the present example, a microcavity effect (interference effect) was obtained between the anode (reflecting electrode) and the cathode (translucent electrode). This made it possible to increase a luminance on a front side and to efficiently propagate light-emitting energy from the organic EL element to a fluorescent layer 3. Further, with the microcavity effect, it was possible to adjust a peak wavelength to be 460 nm and to adjust a half bandwidth to be 50 nm.

(Formation of Inorganic Sealing Film)

Next, an inorganic sealing film (film thickness: 3 μm) made from $SiO_2$ was formed. The inorganic sealing film was formed by patterning by a plasma CVD method by use of the shadow mask so that $SiO_2$ was provided in a sealing area which had a width of 2 mm and extended around a display region.

With the process described above, manufacturing of a light source made of an organic EL element was completed.

(Aligning)

The organic EL element and the fluorescent substrate 5 were aligned with respect to each other by use of an alignment marker provided outside the display region. A thermosetting resin serving as a resin sealing film 32 had been applied to the fluorescent substrate in advance. The two substrates were attached to each other via the thermosetting resin, and the thermosetting resin was hardheaded by heating the two substrates at 80° C. for two hours. In order to prevent deterioration of the organic EL element due to moisture, the attaching process was carried out under a dried air environment (amount of moisture: −80° C.).

Finally, terminals formed in a frame region were connected to an external power source. The manufacturing of the organic EL display device was thus completed.

According to the organic EL display device of the present example, a desired current was applied to a desired electrode having a stripe shape by use of an external power source. This allowed the blue light-emitting organic EL to serve as an excitation light source which was switchable arbitrarily. As a result, blue light was converted into red light in the red fluorescent layer. Further, the blue light was converted into green light in the green fluorescent layer. In this way, red light and green light were thus isotropically emitted. Further, blue light was isotropically emitted from the blue light-scattering layer. As a result, the organic EL display device of the present example was capable of carrying out full color display and was capable of displaying an image having high image quality and excellent viewing angle characteristics.

Example 16

The following description will discuss a process of manufacturing a display device in accordance with Example 16. The display device of Example 16 includes at least a light source (blue organic EL element) and a fluorescent substrate. The blue organic EL element is driven by a thin film transistor (hereinafter, referred to as "TFT").

The fluorescent substrate is manufactured in the same manner as Example 15. The following description will discuss a process of manufacturing the blue organic EL element.

First, an amorphous silicon semiconductor film was formed on a glass substrate (100 mm×100 mm square) by a PECVD method. Then, a polycrystalline silicon semiconductor film was formed by a crystallization process. After this, the polycrystalline silicon semiconductor film was subjected to patterning by a photolithography method so that a plurality of islands of the polycrystalline semiconductor film was formed. On the polycrystalline silicon semiconductor film thus patterned, a gate insulating film and a gate electrode layer were formed in this order. Then, patterning was further carried out by a photolithography method.

The polycrystalline silicon semiconductor film thus patterned was doped with an impurity element, such as phosphorus. This formed a source region and a drain region in the polycrystalline silicon semiconductor film. A TFT element was thus formed. Then, a planarizing film was formed. The planarizing film was formed in such a manner that a silicon nitride film and an acrylate resin layer were stacked in this order. The silicon nitride film was formed by a PECVD method, and the acrylate resin layer was formed by use of a spin coater.

First, the silicon nitride film was formed. Then, the silicon nitride film and the gate insulating film were etched by a same etching process. This formed a contact hole reaching one or both of the source region and the drain region. Then, a source line was formed. After that, the acrylate resin layer was formed. Then, another contact hole was formed with respect to the gate insulating film and the silicon nitride film in a position corresponding to the contact hole of the drain region, so that the contact hole and the another contact hole were connected to each other. An active matrix substrate was thus completed.

A function of the planarizing film was realized by the acrylate resin layer. Each capacitor for causing a gate electric potential of a TFT to be a constant electric potential was provided between a drain of a switching TFT and a source of a driving TFT via an insulating film such as an interlayer insulating film.

On the active matrix substrate, a contact hole which penetrated the planarizing layer was provided. The driving TFT, an anode of a red light-emitting organic EL element, an anode of a green light-emitting organic EL element, and an anode of a blue light-emitting organic EL element were electrically connected via the contact hole.

Then, an anode (first electrode) of each pixel was formed by a sputtering method so as to be electrically connected to the contact hole. The anode was formed in such a manner that Al (aluminum) having a film thickness of 150 nm and IZO (indium zinc oxide) having a film thickness of 20 nm were stacked with each other.

Then, the anode was patterned by a conventional photolithography method so as to have a shape corresponding to each pixel. The anode had a size of 300 μm×160 μm. The anode was provided on a substrate of 100×100 square. A display section had a size of 80 mm×80 mm. A sealing area having a width of 2 mm was formed around the display section. Both short sides of the display section were provided with, respectively, terminal extraction sections each having a width of 2 mm and being formed outside the sealing area. One of long sides of the display section, which was on a side where bending was carried out, was provided with a terminal extraction section having a width of 2 mm.

Then, $SiO_2$ (film thickness: 200 nm) was provided on the anode by a sputtering method. After that, $SiO_2$ was patterned by a conventional photolithography method so as to cover an edge section of the anode. Here, $SiO_2$ covers 4 sides of the anode so that a part extending from each side by 10 μm was covered with $SiO_2$. An edge cover was thus formed.

Then, the active substrate was washed. The washing was carried out such that ultrasonic cleaning with the use of acetone and IPA was carried out for 10 minutes. Next, UV-ozone washing was carried out for 30 minutes. The active substrate thus washed was fixed to a substrate holder in an inline resistance heating vapor deposition device. Then, a pressure was decreased to $1×10^{-4}$ Pa or below, i.e., a vacuum condition.

(Formation of Organic Layer)

Each organic layer was formed under the following condition. First, a hole-injection layer having a film thickness of 100 nm was formed by a resistance heating vapor-deposition method with the use of 1,1-bis-di-4-tolylamino-phenyl-cyclohexane (TAPC) as a hole-injection material.

Then, a hole transport layer having a film thickness of 40 nm was formed by a resistance heating vapor-deposition method, by use of N,N'-di-1-naphthyl-N,N'-diphenyl-1,1'-biphenyl-1,1'-biphenyl-4,4'-diamine (NPD) as a hole-transport material.

Next, a blue organic light-emitting layer (thickness: 30 nm) was formed on the hole transport layer. The blue light-emitting organic layer was formed by causing 1,4-bis-triphenyl-silyl-benzene (UGH-2) (host material) and bis[(4,6-difluorophenyl)-pyridinato-N,C2'] picolinate iridium (III) (FIpic) (blue phosphorescent dopant) to be subjected to co-evaporation. The blue light-emitting organic layer was formed in such a manner that a deposition rate of 1,4-bis-triphenylsilyl-benzene (UGH-2) was 1.5 Å/sec, and a deposition rate of bis[(4,6-difluorophenyl)-pyridinato-N,C2'] picolinate iridium (III) (FIpic) was 0.2 Å/sec.

Then, a hole-blocking layer (thickness: 10 nm) was formed on the blue organic light-emitting layer with the use of 2,9-dimethyl-4,7-diphenyl-1,10-phenanthroline (BCP).

Next, an electron transport layer (thickness: 30 nm) was formed on the hole-blocking layer with the use of tris (8-hydroxyquinoline) aluminum ($Alq_3$).

Then, an electron-injection layer (thickness: 0.5 nm) was formed on the electron transport layer with the use of lithium fluoride (LiF).

After this, a cathode was formed in the following manner. First, a substrate was fixed in a metal vapor-deposition chamber. Then, the substrate and a shadow mask for forming the cathode were aligned with respect to each other. Here, the shadow mask for forming the cathode had an opening for forming a cathode having a stripe shape (width: 2 mm). A position of the opening corresponded to a stripe shape of the anode. Via the shadow mask, magnesium and silver were provided on a surface of the electron injection layer by a vacuum deposition (co-evaporation) method, so as to have a desired pattern (thickness: 1 nm). Magnesium was provided at a deposition rate of 0.1 Å/sec and silver was provided at a deposition rate of 0.9 Å/sec.

Then, silver (thickness: 19 nm) was provided on magnesium and silver thus provided at a deposition rate of 1 Å/sec. A purpose of provision of silver was to enhance an interference effect and to prevent a reduction in voltage due to a resistance of a wiring of the cathode. The formation of the cathode was thus completed.

According to the organic EL element of the present example, a microcavity effect (interference effect) was obtained between the anode (reflecting electrode) and the cathode (translucent electrode). This made it possible to increase a luminance on a front side and more efficiently propagate a light-emitting energy from the organic EL element to the fluorescent layer 3. Further, with the microcavity effect, it was possible to adjust (i) a peak wavelength to 460 nm and (ii) a half bandwidth to 50 nm.

(Formation of Inorganic Sealing Film)

Next, an inorganic film was formed which was made from $SiO_2$ (thickness: 3 μm). The inorganic sealing film was formed by patterning by a plasma CVD method by use of the shadow mask so that $SiO_2$ was provided in a sealing area which had a width of 2 mm, and extended around a display region. An organic EL element substrate of an active driving type was thus manufactured.

(Aligning)

The active driving organic EL element substrate and the fluorescent substrate were aligned with respect to each other by use of an alignment marker provided outside the display region. A thermosetting resin serving as a resin sealing film 32 had been applied to the fluorescent substrate in advance. The two substrates were combined to each other via the thermosetting resin, and the thermosetting resin was hardened by heating the two substrates at 80° C. for 2 hours. In order to prevent deterioration of the organic EL element due to moisture, the attaching process was carried out under a dried air environment (amount of moister: −80° C.).

Then, a polarizing plate was attached to the substrate on a light-extraction side. Formation of The active driving organic EL was thus completed.

Finally, a terminal formed in the vicinity of each short side was connected to a power supply circuit via a source driver, and a terminal formed in the vicinity of a long side was connected to an external power source via a gate driver. Formation of an organic EL display of an active driving type, having a display section having a size of 80 mm×80 mm, was thus completed.

According to the organic EL display device of the active driving type, in accordance of the present example, a desired current was applied to each electrode by use of an external power source. This allowed the blue light-emitting organic EL to serve as an excitation light source which was switchable arbitrarily. As a result, blue light was converted into red light in the red fluorescent layer. Further, the blue light was converted into green light in the green fluorescent layer. With these fluorescent layers, red light and green light were isotropically emitted. Further, blue light was emitted isotropically from the blue light-scattering layer. As a result, the organic EL display device of the present example was capable of carrying out full color display and was capable of displaying an image having high image quality and excellent viewing angle characteristics.

Example 17

The following description will discuss a process of manufacturing an LED display device in accordance with Example 17. First, on a C-plane of a sapphire substrate placed in a reactor vessel, a buffer layer (film thickness: 60 nm) made from GaN was grown at 550° C. with the use of trimethylgallium (TMG) and ammonia ($NH_3$). Then, a temperature was raised to 1,050° C., and an n-type contact layer (film thickness: 5 μm) made from Si-doped n-type GaN was grown with the use of TMG, $NH_3$, and $SiH_4$. Then, a second clad layer (film thickness: 0.2 μm) made from an Si-doped n-type $Al_{0.3}Ga_{0.7}N$ layer was grown at 1,050° C. by addition of trimethylaluminum (TMA) to a source gas. Then, the temperature was decreased to 850° C., and a first n-type clad layer (film thickness: 60 nm) made from Si-doped n-type $In_{0.01}Ga_{0.99}N$ was grown with the use of TMG, trimethylindium (TMI), $NH_3$, and $SiH_4$.

Then, an active layer (film thickness: 5 nm) made from non-doped $In_{0.05}Ga_{0.95}N$ was grown at 850° C. with the use of TMG, TMI, and $NH_3$. Further, a first p-type clad layer (film thickness: 60 nm) made from Mg-doped p-type $In_{0.01}Ga_{0.99}N$ was grown at 850° C. with the use of TMG, TMI, $NH_3$, and cyclopentadienylmagnesium (CPMg).

Then, the temperature was raised to 1,100° C., and a second p-type clad layer (film thickness: 150 nm) made from Mg-doped p-type $Al_{0.3}Ga_{0.7}N$ was grown with the use of TMG, TMA, $NH_3$, and CPMg.

Then, a p-type contact layer (film thickness: 600 nm) made from Mg-doped p-type GaN was grown at 1,100° C. with the use of TMG, $NH_3$, and CPMg.

After the processes described above were finished, the temperature was decreased to room temperature, and a wafer was taken out from the reactor vessel. Then, the wafer was annealed at 720° C. so that p-type layers were decreased in resistance. Then, a mask having a predetermined shape was formed on an uppermost p-type contact layer, and etching was carried out until a surface of the n-type contact layer was exposed. After the etching was carried out, a negative electrode made from titanium (Ti) and aluminum (Al) was formed on the surface of the n-type contact layer. Further, a positive electrode made from nickel (Ni) and gold (Au) was formed on the surface of the p-type contact layer.

After these electrodes were formed, a wafer was divided into chips each having a size of 350 μm square. Then, an LED chip thus manufactured was fixed, with the use of an UV curable resin, to the substrate on which a wiring to be connected to an external power source independently provided was formed. Further, the LED chip and the wiring on the substrate were electrically connected to each other. A light source substrate including a blue LED was thus manufactured.

(Aligning)

The light source substrate and the fluorescent substrate thus manufactured were aligned with respect to each other by use of an aligning marker provided outside the display section. A thermosetting resin serving as a resin sealing film 32 had been applied to the fluorescent substrate in advance. The two substrates were combined to each other via the thermosetting resin, and the thermosetting resin was hardened by heating the two substrates at 80° C. for 2 hours. In order to prevent deterioration of the organic EL element due to moisture, the attaching was carried out under a dried air environment (moisture in the dried air environment was equal to a saturated water vapor amount at −80° C.).

Finally, terminals formed in the vicinity of a display section were connected to an external power source. Formation of an LED display device was thus completed.

According to the LED display device of the present example, a desired current was applied to a desired electrode having a stripe shape by use of an external power source. This allowed the blue light-emitting organic EL to serve as an excitation light source which was switchable appropriately. As a result, blue light was converted into red light in the red fluorescent layer. Further, the blue light was converted into green light in the green fluorescent layer. In this way, red light and green light were thus isotropically emitted. Further, blue light was isotropically emitted from the blue light-scattering layer. As a result, the LED display device of the present example was capable of carrying out full color display and was capable of displaying an image having high image quality and excellent viewing angle characteristics.

Example 18

The following description will discuss a process of manufacturing a display device in accordance with Example 18. First, a fluorescent substrate was obtained by forming a red fluorescent layer, a green fluorescent layer, and a blue fluorescent layer on a glass substrate having a thickness of 0.7 mm. Then, a low-reflecting layer made from chrome was formed on the fluorescent substrate, which low-reflecting layer had a trapezoid shape having a width of 20 μm and a film thickness of 500 nm. A pitch between adjacent ones of low-reflecting layers was 200 μm. Then, a surface of the low-reflecting layer was subjected to a water-shedding process by a $CF_4$ plasma process.

The red fluorescent layer was formed in the following manner. First, [2-[2-[4-(dimethylamino) phenyl]ethenyl]-6-methyl-4H-pyrane-4-ylidene]-propanedinitrile (DCM) (0.02 mol/kg (solid content ratio)) was mixed into an epoxy thermoset resin and stirred by use of a stirrer. This produced a coating solution for forming the red fluorescent layer. Then, the coating solution thus obtained was applied to a region of the glass substrate by an ink jet method, in which region no low-reflecting layer was formed. Then, the coating solution thus applied was cured at 150° C. in a vacuum oven for 1 hour. This produced the red fluorescent layer which had a film thickness of 2 μm. Note, here, that a cross section of the red fluorescent layer had a dome shape, because of an effect of the water-shedding process carried out with respect to the surface of the low-reflecting layer.

The green fluorescent layer was formed in the following manner. First, 2,3,6,7-tetrahydro-11-oxo-1H,5H, 11H-[1] benzopyran [6,7,8-ij] quinolizine-10-carboxylic acid (coumalin 519) (0.02 mol/kg (solid content ratio)) was mixed into an epoxy thermoset resin and stirred by a stirrer. This produced a coating solution for forming the green fluorescent layer. Then, the coating solution thus obtained was applied to the region of the glass substrate by an ink jet method, in which region no low-reflecting layer was formed. Then, the coating solution thus applied was cured at 150° C. in a vacuum oven for 1 hour. This provided the green fluorescent layer which has a film thickness of 2 μm. Note, here, that a cross section of the green fluorescent layer had a dome shape, because of the effect of the water-shedding process carried out with respect to the surface of the low-reflecting layer.

The blue fluorescent layer was formed in the following manner. First, 7-hydroxy-4-methylcoumarin (coumarin 4) (0.02 mol/kg (solid content ratio)) was mixed into an epoxy thermoset resin and stirred by a stirrer. This produced a coating solution for forming the blue fluorescent layer. Then, the coating solution thus obtained was applied to the region of the glass substrate by an ink jet method, in which region no low-reflecting layer was formed. Then, the coating solution thus applied was cured at 150° C. in a vacuum oven for 1 hour. This provided the blue fluorescent layer which has a film thickness of 2 μm. Note, here, that a cross section of the blue fluorescent layer had a dome shape, because of the effect of the water-shedding process carried out with respect to the surface of the low-reflecting layer.

Figure 10:
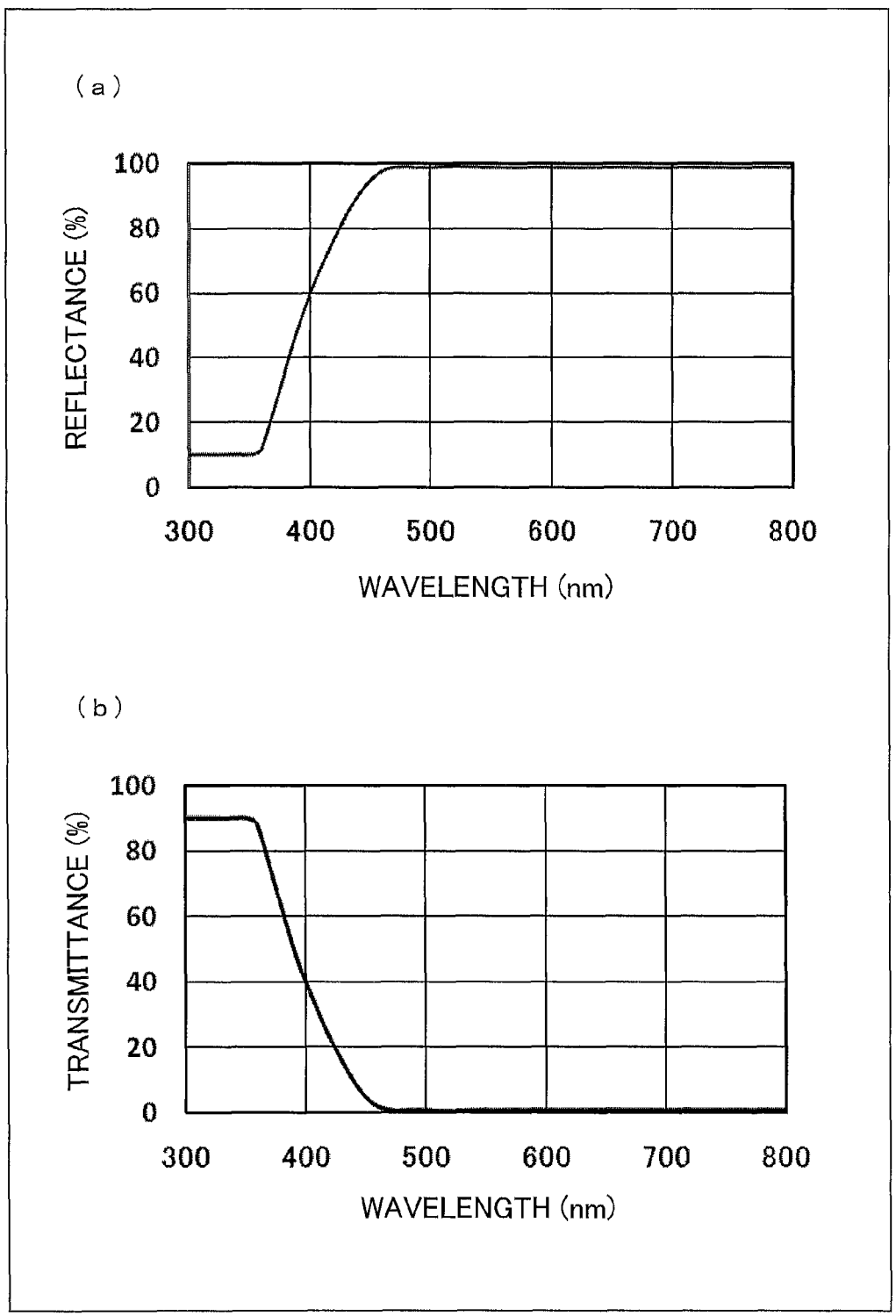
FIG. 10 is a view illustrating a reflectance spectrum and a transmission spectrum of a reflecting layer in accordance with Example 18: (a) of FIG. 10 illustrates the reflectance spectrum of the reflecting layer in accordance with Example 18; and (b) of FIG. 10 illustrates the transmission spectrum of the reflecting layer in accordance with Example 18.
Figure 11:
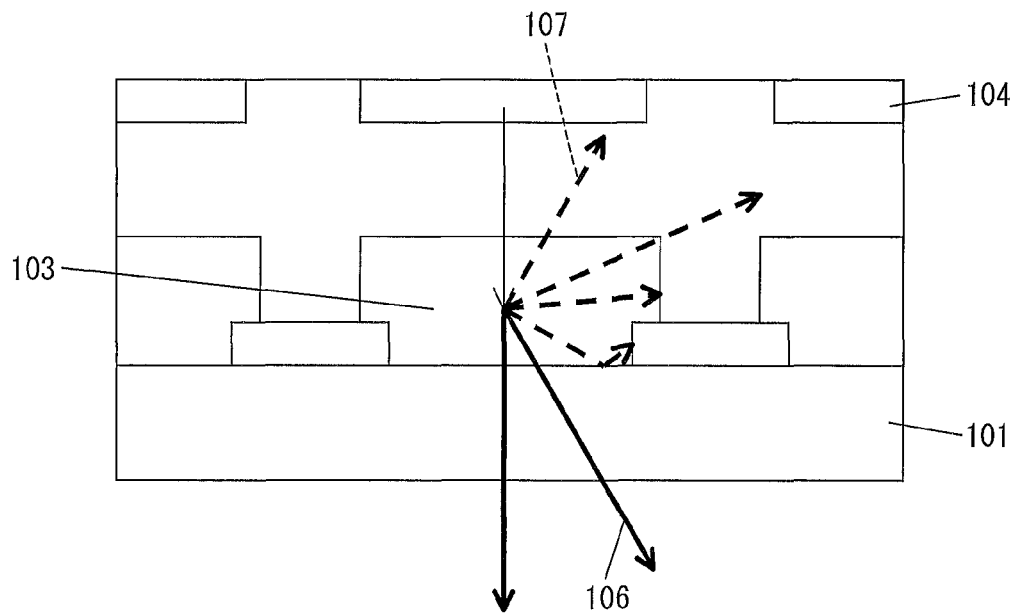
FIG. 11 is a cross sectional view schematically illustrating a configuration example of a display device in accordance with a conventional art.

Next, a dielectric multilayer film was formed as the reflecting layer. The dielectric multilayer film was made of 6 layers, and was formed in such a manner that titanium oxide ($TiO_2$: refractive index=2.30) and silicon oxide ($SiO_2$: refractive index=1.47) were provided by an EB vapor-deposition method alternately. This formed the reflecting layer which had a reflectance spectrum illustrated in FIG. 10 and a transmission spectrum illustrated in FIG. 10. FIG. 10 is a view illustrating the reflectance spectrum and the transmission spectrum of the reflecting layer in accordance with Example 18.

Next, a planarizing film was formed on the reflecting layer by a spin coating method, with the use of an acrylate resin. Then, a polarizing film, a transparent electrode, and an alignment film were formed on the planarizing film by a conventional method. This produced a fluorescent substrate.

Then, a switching element constituted by a TFT was formed on a glass substrate by a conventional method. Then, an ITO transparent electrode having a film thickness of 100 nm was formed so as to be electrically connected to the TFT via a contact hole. Then, the transparent electrode was patterned by a typical photolithography method so as to have a pitch identical to a pitch of pixels provided in an organic EL section manufactured earlier. Then, an alignment film was formed by a printing method.

Then, the substrate, on which the TFTs were formed, and the fluorescent substrate were adhered to each other with spacers of 10 μm provided therebetween. A TN mode liquid crystal material was injected between the substrate and the fluorescent substrate. Formation of a liquid crystal section and a fluorescent section was thus completed.

Next, silver (thickness: 100 nm) was provided, by a sputtering method, on a glass substrate having a thickness of 0.7 mm. Then, an indium-tin oxide (ITO) (thickness: 20 nm) was formed on the silver by a sputtering method. This produced a reflecting electrode which served as an anode. After this, patterning was carried out by a conventional photolithography method so that the anode had a desired size.

Then, $SiO_2$ (thickness: 200 nm) was formed on the anode by a sputtering method. Further, $SiO_2$ was patterned by a typical photolithography method so as to cover only an edge section of the anode. Here, $SiO_2$ covered the edge part of the anode so that a part extending from each short side by 10 μm was covered. After that, the substrate was washed with water, and then was subjected to ultrasonic cleaning with the use of purified water (10 minutes), and after that was subjected to ultrasonic cleaning with the use of acetone (10 minutes). Then, the substrate was subjected to vapor cleaning with the use of isopropyl alcohol (5 minutes). Then, the substrate was dried at 120° C. for 1 hour.

Then, this substrate was fixed to a substrate holder in an electric resistance heating vapor-deposition device. Then, an ambient air pressure was decreased to $1 \times 10^{-4}$ Pa or lower, i.e., a vacuum condition.

Under such a condition, each of organic layers was formed. First, a hole injection layer, which had a film thickness of 100 nm, was formed by a resistance heating vapor-deposition method with the use of 1,1-bis-di-4-tolylamino-phenyl-cyclohexane (TAPC) as a hole injection material. Then, a hole transport layer, which had a film thickness of 10 nm, was formed by a resistance heating vapor-deposition method with the use of carbazolebiphenyl (CBP) as a hole transport material. Then, a near-ultraviolet light-emitting organic layer (thickness: 30 nm) was formed on the hole transport layer. The near-ultraviolet light-emitting organic layer was formed by vapor-depositing 3,5-bis (4-t-) butyl-phenyl)-4-phenyl-[1,2,4] triazole (TAZ) (near-ultrasonic phosphorescent material) at a deposition rate of 1.5 Å/sec.

Then, an electron transport layer (thickness: 20 nm) was formed on the light-emitting layer with the use of 2,9-dimethyl-4,7-diphenyl-1,10-phenanthroline (BCP). Then, an electron injection layer (thickness: 0.5 nm) was formed on the electron transport layer with the use of lithium fluoride (LiF).

After that, a cathode was formed in the following manner. First, the substrate was fixed to a metal vapor-deposition chamber. Then, the substrate and a shadow mask for forming the cathode were aligned with respect to each other. Here, the shadow mask had an opening for forming a cathode having a stripe pattern (width: 500 μm, pitch: 600 μm). A position of the opening corresponded to a position of a stripe of the anode. Via the shadow mask, magnesium and silver were provided on a surface of the electron injection layer by a vacuum deposition (co-evaporation) method, so as to have a desired pattern (thicknesses: 1 nm). Magnesium was deposited at a deposition rate of 0.1 Å/sec and silver was deposited at a deposition rate of 0.9 Å/sec.

Then, silver was provided on magnesium and silver at a deposition rate of 1 Å/sec so as to have a desired pattern (thickness: 19 nm). A purpose of this was to enhance an interference effect and prevent a reduction in voltage due to a resistance of a wiring of the cathode. Formation of the cathode was thus completed.

According to the organic EL element of the present example, a microcavity effect is caused between the anode (reflecting electrode) and the cathode (the translucent electrode). This made it possible to increase a luminance on a front side and more efficiently propagate a light-emitting energy from the organic EL element to the fluorescent layer 3. Also, with the microcavity effect, it was possible to adjust a luminescence peak to 370 nm and a half bandwidth to 30 nm.

Then, an inorganic protection layer, which was made from $SiO_2$ and had a thickness of 3 μm, was formed by a plasma CVD method. After that, the inorganic protection layer was patterned by use of a shadow mask so that $SiO_2$ was provided in a sealing region (width: 2 mm) around a display section. A light source substrate including an organic EL element was thus manufactured.

Finally, (i) an organic EL section and (ii) a liquid crystal section and fluorescent section were aligned to each other. Then, they were attached to each other via a thermosetting resin, and adhered to each other by curing the thermosetting resin. A display device was thus manufactured.

In the display device, a current was applied from an external power source so as to cause a desired organic EL section to emit light. While the current was applied, a desired voltage was applied, from an external power source, to an electrode for driving liquid crystal. As a result, it was possible for the display device to display a desired image having high display quality and excellent viewing angle characteristics.

In order to attain the object, a fluorescent substrate of the present invention is a fluorescent substrate including: a fluorescent layer which emits light by receiving excitation light; and a reflecting film being provided both (i) on a side surface(s) of the fluorescent layer and (ii) on a surface of the fluorescent layer, on which surface the excitation light is incident, the reflecting film (I) transmitting a component having a peak wavelength of the excitation light, and (II) reflecting a component having a peak wavelength of the light.

According to the arrangement, the reflecting film transmits the component having the peak wavelength of the excitation light, so that it is possible to minimize a loss of the excitation light which travels to the fluorescent layer. Further, according to the arrangement, the reflecting film reflects the component having the peak wavelength of the light emitted from the fluorescent layer. As such, even though the light is istropiclaly emitted in the fluorescent layer, light emitted toward the side surfaces of the fluorescent layer is returned (reflected) to the inner part of the fluorescent layer by the reflecting film on the side surfaces of the fluorescent layer. By this, the reflecting film can prevent loss of the light emitted toward the side surfaces of the fluorescent layer. As such, it is possible to re-extract, from a desired extraction point, the light emitted toward the side surfaces of the fluorescent layer. Further, that portion of the isotropically emitted light, which is emitted toward the excitation light incident surface of the fluorescent layer, is returned (reflected) to the inner part of the fluorescent layer by the reflecting film, so that it is possible to extract this portion of the isotropically emitted light from a light-extraction direction of the fluorescent layer. With the arrangement described above, it is thus possible to greatly improve light-emitting efficiency, that is, it is possible to greatly increase a luminance of light emitted in the light-extraction direction.

In the case of an illuminant like the fluorescent layer, light emitted from a surface on which excitation light is incident (excitation light entrance surface) accounts for 30% of a total light emission, and light emitted from a side surface accounts for 40% of the total light emission. In view of the circumstances, it is very effective to increase in luminance efficacy to extracted, to the light-extraction direction, leak light emitted from the excitation light entrance surface and the side surface(s).

It is preferable that the fluorescent substrate of the present invention is configured so that the reflecting layer (i) transmits 80% or more of the component having the peak wavelength of the excitation light and (ii) reflects 80% or more of the component having the peak wavelength of the light emitted from the fluorescent layer.

With the arrangement, it is possible to efficiently extract fluorescence isotropically emitted in the fluorescent layer. This makes it possible to improve a light-emitting efficiency.

It is preferable that the fluorescent substrate of the present invention is configured so that the reflecting layer (i) transmits 90% or more of the component having the peak wavelength of the excitation light and (ii) reflects 90% or more of the component having the peak wavelength of the light emitted from the fluorescent layer.

With the arrangement, it is possible to more efficiently extract fluorescence isotropically emitted in the fluorescent layer. This makes it possible to more improve the light-emitting efficiency.

It is preferable that the fluorescent substrate of the present invention is configured so that: an excitation light incident side of the reflecting film serves as a front side; a light-extraction side of the fluorescent substrate serves as a backside; and a maximum film thickness of the reflecting film on the side surface(s) of the fluorescent layer is greater than a maximum film thickness of the reflecting film on the front side.

With the arrangement, it is possible to maintain the transmittance (at which the excitation light is transmitted into the fluorescent film) of the reflecting layer on the excitation light incident side to be high more efficiently, while causing the light emitted toward the side surface(s) of the fluorescent layer to be returned (reflected) into the fluorescent layer. This makes it possible to more efficiently extract light isotropically emitted in the fluorescent layer. Accordingly, it is possible to further improve the light-emitting efficiency.

It is preferable that the fluorescent substrate of the present invention is configured so that the reflecting layer contains at least gold.

The arrangement can efficiently transmit the excitation light and efficiently reflect the light emitted from the fluorescent layer. This makes it possible to efficiently extract, to the light-extraction direction, the light emitted in the fluorescent layer.

It is preferable that a thickness of the reflecting film thus containing at least gold is in a range of 10 nm to 40 nm. With its thickness in this range, the reflecting film thus containing at least gold can exhibit both a characteristic of transmitting the excitation light and a characteristic of reflecting the light emitted from the fluorescent layer. This makes it possible to more efficiently extract, to the outside, the light emitted in the fluorescent layer. If the thickness of the reflecting film thus containing at least gold is 10 nm or smaller, then there is an improvement in the characteristic of transmitting the excitation light. This allows a larger energy of the excitation light to propagate to the fluorescent layer so that a luminance of the fluorescent material is increased. In this case, however, the characteristic of reflecting the light isotropically emitted in the fluorescent layer becomes low. This results in a reduction in an intensity of light extracted on the light-extraction side. On the other hand, if a thickness of the reflecting film thus containing at least gold is 40 nm or larger, then there is an improvement in the characteristic of reflecting the light isotropically emitted in the fluorescent layer and an improvement in the characteristic of transmitting isotropically-emitted excitation light on the lateral side. This allows a larger energy of the excitation light to propagate to the fluorescent layer so that a luminance of the fluorescent material is increased. However, an intensity of light extract on the light-extraction side is decreased.

It is preferable that the fluorescent substrate of the present invention is configured so that the fluorescent layer is made from an inorganic fluorescent material.

The arrangement makes it possible to cause light returning from a side surface of the reflecting film into the fluorescent layer to travel toward a light-extraction side (according to a conventional technique, this light is reflected between side surfaces of the reflecting film, and deactivated due to self-absorption in the fluorescent layer) by taking advantage of a scattering effect (a scattering effect of an inorganic fluorescent material) of the fluorescent layer. As a result, it becomes possible to efficiently extract, to the outside, the light emitted from the fluorescent layer. Accordingly, it is possible to further improve the light-emitting efficiency.

It is preferable that the fluorescent substrate of the present invention is configured so that: the fluorescent layer is constituted by a plurality of sorts of fluorescent layer provided on the fluorescent substrate, which plurality of sorts of fluorescent layer are made from different fluorescent materials, respectively; and a light-absorbing layer is provided in each space between adjacent ones of the plurality of sorts of fluorescent layer.

The arrangement makes it possible to decrease or even block diffusion light (light emission) which is isotropically emitted from each fluorescent layer and leaks to a fluorescent layer for another pixel. This can prevent excitation light, not absorbed in the fluorescent layer and transmitted through the fluorescent layer, from leaking to the outside. As such, it is possible to reduce or even prevent a decrease in contrast.

It is preferable that the fluorescent substrate of the present invention is configured so that the fluorescent layer is formed to have a tapered shape.

With the arrangement, it is possible to provide the reflecting layer both on the side surface(s) and on the excitation light incident surface of the fluorescent layer easily and simultaneously. This can prevent an increase in cost. Further, since the reflecting layer can be uniformly provided on the fluorescent layer, it is possible to cause, more efficiently, the light isotropically emitted from the fluorescent layer to be in the light-extraction direction. Note that, if the reflecting layer is not uniform, then there is unevenness in reflection characteristic. This results in a decrease in light-extraction efficiency.

It is preferable that the fluorescent substrate of the present invention is configured so that the reflecting film is such that a film thickness of the reflecting film is reduced as being closer to the front side.

In fact, excitation light emitted from each excitation light source diffuses at a certain angle. With the arrangement described above, it is possible to maintain the transmittance (at which the excitation light is transmitted into the fluorescent film) of the reflecting layer on the excitation light incident side to be high more efficiently, while causing the diffusing light emitted from the excitation light source provided lateral to the side surface of the fluorescent layer toward the side surface(s) of the fluorescent layer to be returned (reflected) into the fluorescent layer. This makes it possible to more efficiently extract, to the outside, the light isotropically emitted from the fluorescent layer. Accordingly, it is possible to further improve the light-emitting efficiency.

In order to attain the object, a display device of the present invention includes: any of the fluorescent substrates described above; and a light source for emitting, toward the fluorescent substrate, excitation light which (i) has a peak wavelength in a range from an ultraviolet region to a blue-color region and (ii) excites the fluorescent layer.

The arrangement makes it possible to improve the light-emitting efficiency of the display device and decreases power consumption and cost of the display device.

It is preferable that the display device of the present invention is configured so that the light source includes an organic electroluminescence element, an inorganic electroluminescence element, or a light-emitting diode.

The arrangement makes it possible to decreases cost and power consumption of the display device.

It is preferable that the display device of the present invention is configured so that the light source is driven by an active element.

The arrangement makes it possible to extend a light-emitting period of the light source, as compared to an arrangement employing passive driving. This can decrease an instantaneous luminance required for a desired luminance and can decrease a drive voltage. As such, with the arrangement, power consumption can be decreased. Further, because it is possible to drive the light source in that region of a low luminance region where the light-emitting efficacy is more increased, it is similarly possible to decrease power consumption.

It is preferable that the display device of the present invention is configured so that the light emitted from the fluorescent layer is emitted from a substrate which is provided to face another substrate on which the active element is provided.

The arrangement makes allows an aperture ratio of each pixel to be increased without being affected by active elements, lines, etc. provided on and above the substrate. As such, it is possible to provide the display device which achieves a decrease in power consumption.

It is preferable that the display device of the present invention is configured so that a liquid crystal element provided between the fluorescent substrate and the light source, the liquid crystal element being subjected to switching by receiving a voltage.

The arrangement allows use of a combination of liquid crystals and switching elements. As such, it is possible to provide the display device which has excellent display quality.

In order to attain the object, a method of the present invention for manufacturing a fluorescent substrate includes the steps of: (a) providing a fluorescent layer on a substrate, the fluorescent layer emitting light by receiving excitation light; and (b) providing a reflecting film both (i) on a side surface(s) of the fluorescent layer and (ii) on a surface of the fluorescent layer, on which surface the excitation light is incident, the film (I) transmitting a component having a peak wavelength of the excitation light and (II) reflecting a component having a peak wavelength of the light emitted from the fluorescent layer.

The arrangement makes it possible to manufacture a fluorescent substrate in which there can be an increase in the light-emitting efficacy (that is, there can be an increase in luminance of light extracted to a light-extraction direction).

It is preferable that the fluorescent substrate of the present invention is arranged so that, in the step (a), the fluorescent layer is provided by a screen printing method, an ink-jet method, or a nozzle coat method.

According to the method, the fluorescent layer can be directly patterned in the substrate. This can greatly increase a use efficiency of a fluorescent material, as compared with a case of patterning the fluorescent layer by a photolithography method. It is therefore possible to manufacture the fluorescent substrate at a lower cost.

Further, by combining a wet process and a water-repellent process, it is possible to carry out control so that the fluorescent layer is efficiently caused to have a desired cross section shape. Hence, it is possible to directly form a cross section shape required for efficient light extraction.

INDUSTRIAL APPLICABILITY

The fluorescent substrate of the present invention has excellent luminance conversion efficiency and is thereby suitably applicable to a display device.

REFERENCE SIGNS LIST

1: substrate
2: light absorption layer
3: fluorescent layer
4: light source
5: fluorescent substrate
10: reflecting layer
11: substrate
12: anode
13: edge cover
14: hole-injection layer
15: hole transport layer
16: light-emitting layer
17: hole-blocking layer
18: electron transport layer
19: electron-injection layer
20: cathode
21: buffer layer
22: n-type contact layer
23: second n-type clad layer
24: first n-type clad layer
25: active layer
26: first p-type clad layer
27: second p-type clad layer
28: electrode
29: dielectric layer
30: light-emitting layer
31: inorganic seal film
32: resin seal film
33: red light-emitting fluorescent layer
34: green light-emitting fluorescent layer
35: scatter layer
36: gate electrode
37: drain electrode
38: source electrode
42: planarizing layer
43: blue light-emitting fluorescent layer
44: polarizing plate
45: substrate
46: transparent electrode
47: alignment film
48: liquid crystal layer
49: planarizing film
50: display device
51: p-type contact layer
52: gate line
53: interlayer insulating film
54: source line

The invention claimed is:

1. A fluorescent substrate comprising:
   a fluorescent layer which emits light by receiving excitation light; and
   a reflecting film being provided both (i) on a side surface(s) of the fluorescent layer and (ii) on a surface of the fluorescent layer, on which surface the excitation light is incident, the reflecting film (I) transmitting a component having a peak wavelength of the excitation light, and (II) reflecting a component having a peak wavelength of the light emitted from the fluorescent layer, the reflecting film containing at least gold.

2. The fluorescent substrate as set forth in claim 1, wherein:
   the reflecting film (i) transmits 80% or more of the component having the peak wavelength of the excitation light and (ii) reflects 80% or more of the component having the peak wavelength of the light emitted from the fluorescent layer.

3. The fluorescent substrate as set forth in claim 2, wherein:
   the reflecting film (i) transmits 90% or more of the component having the peak wavelength of the excitation light and (ii) reflects 90% or more of the component having the peak wavelength of the light emitted from the fluorescent layer.

4. The fluorescent substrate as set forth in claim 1, wherein:
   an excitation light incident side of the reflecting film serves as a front side;
   a light-extraction side of the fluorescent substrate serves as a backside; and
   a maximum film thickness of the reflecting film on the side surface(s) of the fluorescent layer is greater than a maximum film thickness of the reflecting film on the front side.

5. The fluorescent substrate as set forth in claim 1, wherein:
   a film thickness of the reflecting film containing at least gold is in a range of 10 nm to 40 nm.

6. The fluorescent substrate as set forth in claim 1, wherein:
   the fluorescent layer is made from an inorganic fluorescent material.

7. The fluorescent substrate as set forth in claim 1, wherein:
   the fluorescent layer is constituted by a plurality of sorts of fluorescent layer provided on the fluorescent substrate, which plurality of sorts of fluorescent layer are made from different fluorescent materials, respectively; and
   a light-absorbing layer is provided in each space between adjacent ones of the plurality of sorts of fluorescent layer.

8. The fluorescent substrate as set forth in claim 1, wherein:
   the fluorescent layer is formed to have a tapered shape.

9. The fluorescent substrate as set forth in claim 4, wherein:
   the reflecting film is such that a film thickness of the reflecting film is reduced as being closer to the front side.

10. A display device comprising:
    a fluorescent substrate recited in claim 1; and
    a light source for emitting, toward the fluorescent substrate, excitation light which (i) has a peak wavelength in a range from an ultraviolet region to a blue-color region and (ii) excites the fluorescent layer.

11. The display device as set forth in claim 10, wherein:
    the light source includes an organic electroluminescence element, an inorganic electroluminescence element, or a light-emitting diode.

12. The display device as set forth in claim 11, wherein:
    the light source is driven by an active element.

13. The display device as set forth in claim 12, wherein:
    the light emitted from the fluorescent layer is emitted from a substrate which is provided to face another substrate on which the active element is provided.

14. The display device as set forth in claim 10, further comprising:
    a liquid crystal element provided between the fluorescent substrate and the light source, the liquid crystal element being subjected to switching by receiving a voltage.

15. A method of manufacturing a fluorescent substrate, the method comprising the steps of:
    (a) providing a fluorescent layer on a substrate, the fluorescent layer emitting light by receiving excitation light; and
    (b) providing a film both (i) on a side surface(s) of the fluorescent layer and (ii) on a surface of the fluorescent layer, on which surface the excitation light is incident, the film (I) transmitting a component having a peak wavelength of the excitation light and (II) reflecting a component having a peak wavelength of the light emitted from the fluorescent layer, the reflecting film containing at least gold.

16. The method as set forth in claim 15, wherein:
    in said step (a), the fluorescent layer is provided by a screen printing method, an ink jet method, or a nozzle coat method.

* * * * *